United States Patent [19]

Ikeda et al.

[11] Patent Number: 5,057,894
[45] Date of Patent: Oct. 15, 1991

[54] SEMICONDUCTOR INTEGRATED CIRCUIT DEVICE

[75] Inventors: Takahide Ikeda, Tokorozawa; Kouichirou Yamada, Mitaka; Osamu Saito, Tokyo; Masanori Odaka, Kodaira; Nobuo Tamba, Ohme; Katsumi Ogiue, Hinode; Atsushi Hiraishi, Hitachi; Atsuo Watanabe, Hitachiohta; Mitsuru Hirao, Tohkai; Akira Fukami; Masayuki Ohayashi, both of Hitachi; Tadashi Kuramoto, Ohme, all of Japan

[73] Assignee: Hitachi, Ltd., Tokyo, Japan

[21] Appl. No.: 526,696

[22] Filed: May 23, 1990

Related U.S. Application Data

[63] Continuation of Ser. No. 192,696, May 10, 1988, abandoned.

[30] Foreign Application Priority Data

May 13, 1987 [JP] Japan ................. 62-116089
Aug. 31, 1987 [JP] Japan ................. 62-217095

[51] Int. Cl.$^5$ .............. H01L 27/02; H01L 29/04; H01L 29/10; H01L 29/72
[52] U.S. Cl. .............. 357/43; 357/59; 357/42; 357/23.3; 357/34
[58] Field of Search .............. 357/43, 59, 42, 23.3, 357/34

[56] References Cited

U.S. PATENT DOCUMENTS

| | | | |
|---|---|---|---|
| 3,673,471 | 6/1972 | Klein et al. | 357/42 |
| 4,450,470 | 5/1984 | Shiba | 357/59 F |
| 4,727,046 | 2/1988 | Tuntasood et al. | 357/59 H |
| 4,737,472 | 4/1988 | Schaber et al. | 357/59 H |
| 4,785,341 | 11/1988 | Ning et al. | 357/59 I |
| 4,808,548 | 2/1989 | Thomas et al. | 357/43 |

OTHER PUBLICATIONS

IEDM Technical Digest, Dec. 1985, pp. 423–426, Watanabe et al.
IEDM Technical Digest, Dec. 1985, pp. 34–37, Vora et al.

Primary Examiner—Mark Prenty
Attorney, Agent, or Firm—Antonelli, Terry, Stout & Kraus

[57] ABSTRACT

Disclosed is a bipolar-CMOS LSI manufactured by a simplified process and realizing a higher density of integration as well as a higher operating speed, in which a base lead-out electrode of a bipolar transistor and respective gate electrodes of a p-channel MISFET and an n-channel MISFET of CMOS transistors are made of an identical conductor film, and the conductor film of the gate electrode of the p-channel MISFET is of p-type, while that of the gate electrode of the n-channel MISFET is of n-type.

14 Claims, 14 Drawing Sheets

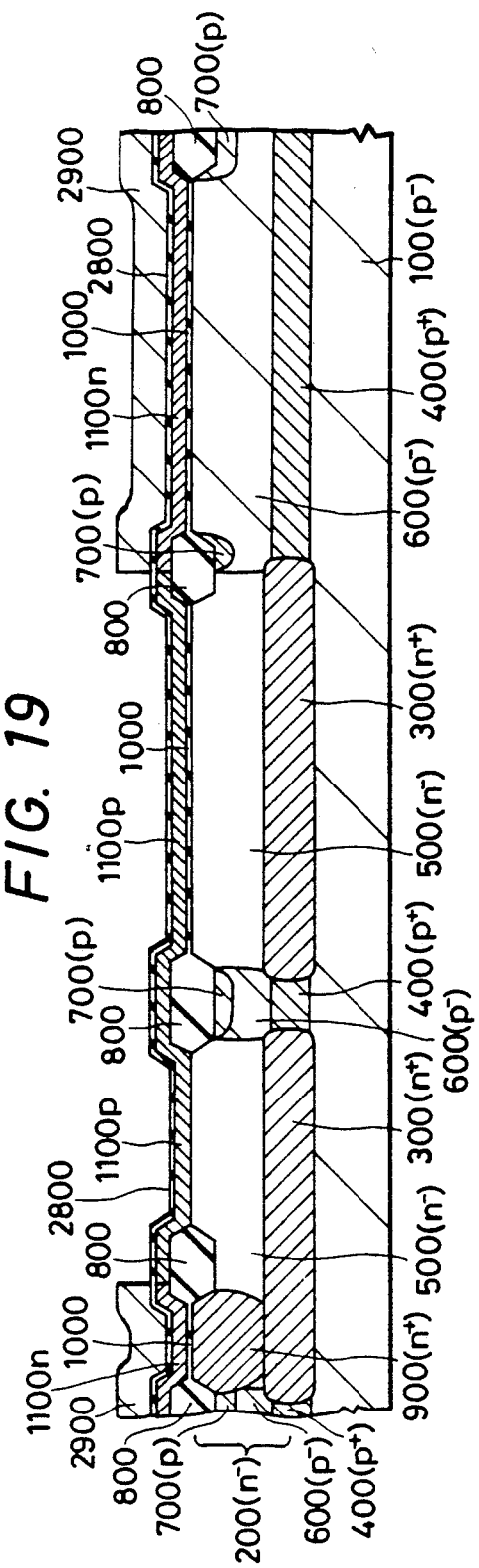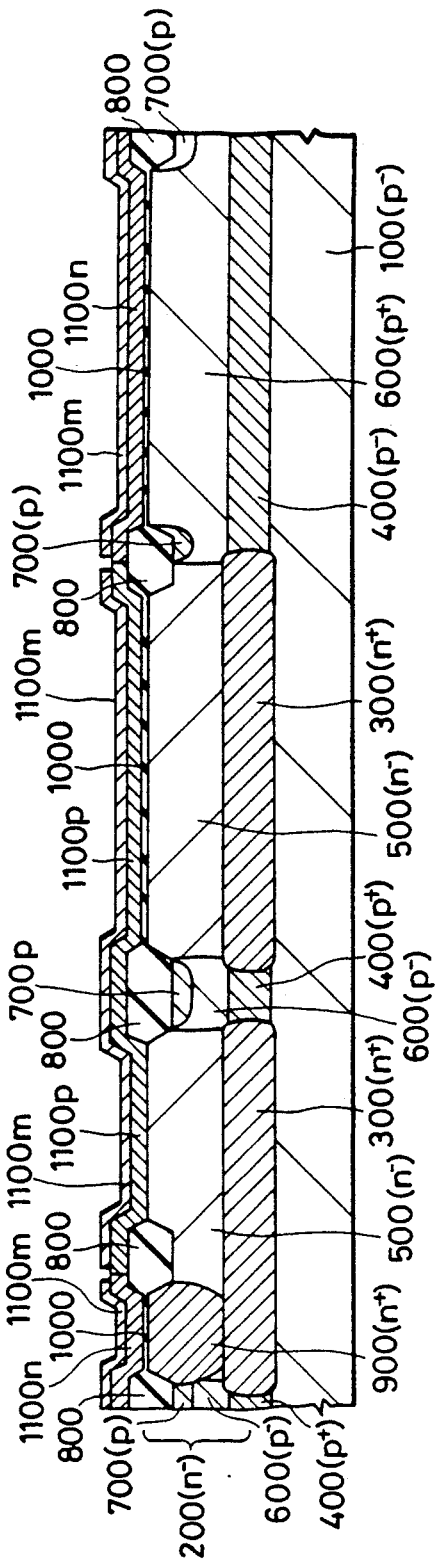

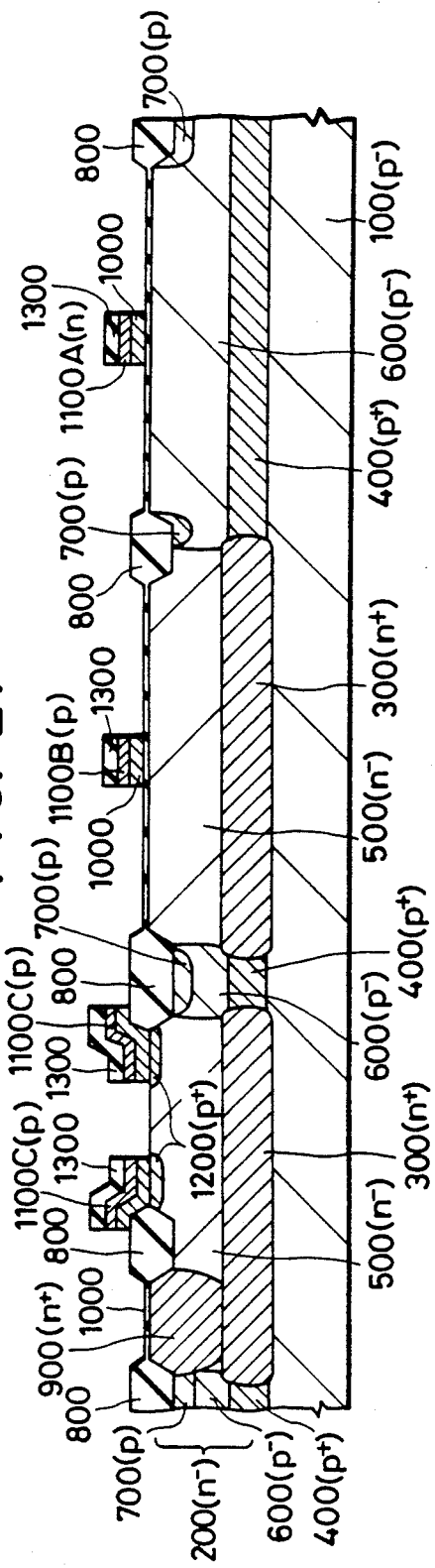
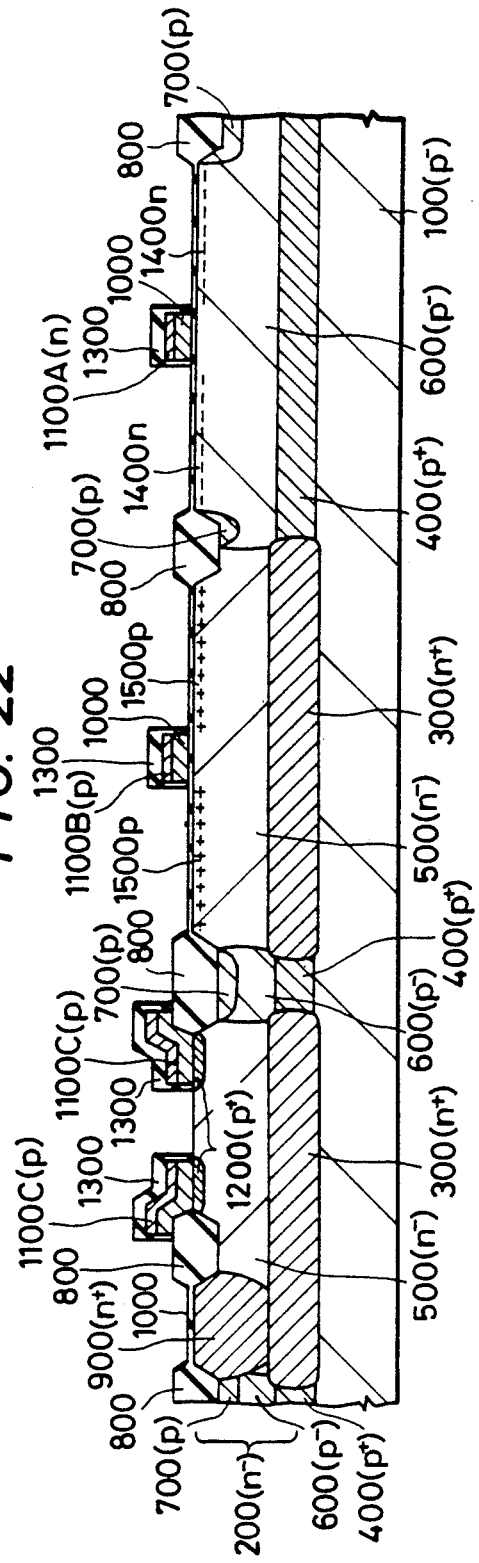

SEMICONDUCTOR INTEGRATED CIRCUIT DEVICE

This application is a continuation application of application Ser. No. 07/192,696, filed May 10, 1988 and now abandoned.

BACKGROUND OF THE INVENTION

The present invention relates to a semiconductor integrated circuit device and a method of manufacturing the same, and more particularly to techniques which are effective when applied to a semiconductor integrated circuit device (bipolar-CMOS LSI) wherein bipolar transistors and MISFETs coexist on an identical substrate.

Heretofore, in case of manufacturing a bipolar-CMOS LSI in which bipolar transistors and complementary MISFETs are formed on an identical substrate, the bipolar transistors have been formed by the simplest possible process through the utilization of CMOS technology in order to avoid the complication of a process for the manufacture.

The bipolar-CMOS LSI is discussed in, for example, "IEDM 1985, Technical Digest," pp. 423–426. A method of manufacturing this bipolar-CMOS LSI is as follows: After an $n^+$-type buried layer and a $p^+$-type buried layer have been formed in a $p^-$-type semiconductor substrate, an epitaxial layer is formed on the semiconductor substrate. Subsequently, an n-well and a p-well are respectively formed in the epitaxial layer so as to correspond to the $n^+$-type and $p^+$-type buried layers. Next, a field insulator film is formed on the selected areas of the surface of the epitaxial layer, whereupon an insulator film is formed on the surfaces of active regions enclosed with the field insulator film. At the next step, the gate electrodes of MISFETs are formed of a first-layer polycrystalline silicon film, whereupon the intrinsic base region of each bipolar transistor is formed by ion implantation. Subsequently, the source regions and drain regions of the n-channel and p-channel MISFETs are formed by ion implantation. The n-channel and p-channel MISFETs are usually put into so-called LDD (Lightly Doped Drain) structures in order to prevent their characteristics from varying due to hot electrons (hot carriers). Accordingly, the source region and drain region are formed in such a way that ion implantation at a low impurity concentration is first carried out using the gate electrode as a mask, that a side wall made of an insulator is subsequently formed on the side surface of the gate electrode, and that ion implantation at a high impurity concentration is thereafter carried out using the side wall as a mask. At the ion implantation steps for forming the source region and drain region of the p-channel MISFET, the graft base region of the bipolar transistor is also formed using a predetermined mask.

Subsequently, part of the insulator film formed on the active region is removed by etching, followed by the formation of a second-layer polycrystalline silicon film on the whole surface of the active region. Subsequently, this polycrystalline silicon film is doped with arsenic by way of example, whereupon the resultant polycrystalline silicon film is patterned to leave only a part corresponding to an emitter region to-be-formed. Next, the semiconductor body in this state is annealed, whereby the arsenic in the polycrystalline silicon film is diffused into the epitaxial layer so as to form the emitter region within the intrinsic base region. The polycrystalline silicon film on the emitter region is left intact, and is used as an emitter electrode. At the next step, an insulator film for passivation is formed on the whole surface of the resultant semiconductor body and is provided with contact holes, whereupon an aluminum film is formed on the whole surface. Subsequently, the aluminum film is patterned to form aluminum electrodes for the emitter, base and collector of the bipolar transistor and aluminum electrodes for the source regions and drain regions of the MISFETs.

In order to raise the operating speed of the bipolar transistor in the bipolar-CMOS LSI, the junction depths of the emitter region and base region need to be reduced. However, when the junction depth of the base region is reduced, there arises the problem that the base resistance of the transistor increases. This is ascribable to the fact that the sheet resistance of the intrinsic base region increases, and that the spacing between the emitter region and the graft base region cannot be narrowed because allowance needs to be made for mask registration.

Meanwhile, as discussed in, for example, "IEDM 1985, Technical Digest," pp. 34–37, in the field of ultrahigh-speed bipolar LSIs, the operating speed of the bipolar transistor is raised by adopting self-alignment technology in order to solve the aforementioned problem. In the bipolar transistor employing the self-alignment technology, a base lead-out electrode made of a $p^+$-type polycrystalline silicon film is connected to a graft (extrinsic) base region which is formed by the diffusion of a p-type impurity from this base lead-out electrode. An insulator film is formed on the side surface and upper surface of the base lead-out electrode, and a polycrystalline silicon emitter electrode made of an $n^+$-type polycrystalline silicon film is formed through this insulator film. An emitter region is formed by the diffusion of an n-type impurity from the polycrystalline silicon emitter electrode. In this case, the base lead-out electrode and the polycrystalline silicon emitter electrode are structurally isolated in self-alignment fashion by the insulator film. Therefore, the spacing between the emitter region and the graft or extrinsic base region can be sufficiently narrowed, so that reduction in the base resistance can be achieved.

SUMMARY OF THE INVENTION

However, the prior-art bipolar-CMOS LSI stated above has the problem that the manufacturing steps are complicated. Besides, in the case where the bipolar transistor conforming to the self-alignment technology stated above is formed on an identical substrate together with CMOS transistors, the mere combination of the manufacturing processes of the bipolar and CMOS transistors results in conspicuously increasing the number of manufacturing steps.

An object of the present invention is to provide techniques which can simplify the manufacturing process of a semiconductor integrated circuit device having a bipolar transistor and MISFETs.

The above and other objects and novel features of the present invention will become apparent from the description of this specification and the accompanying drawings.

Typical aspects of performance of the present invention are briefly summarized as follows:

In the first aspect of performance, the base lead-out electrode of a bipolar transistor and the gate electrodes of MISFETs are made of the same conductor film (layer) formed by an identical manufacturing step.

Besides, in the second aspect of performance, there are comprised the step of forming a conductor film on a whole surface, and the step of patterning the conductor film thereby to simultaneously form the base lead-out electrode of a bipolar transistor and the gate electrodes of MISFETs.

According to the above-stated expedient in the first aspect of performance, the base lead-out electrode and the gate electrodes are made of the conductor film (layer) formed by the identical manufacturing step, so that the number of manufacturing steps decreases to this extent, and hence, the simplification of the manufacturing process of a semiconductor integrated circuit device can be achieved.

Besides, according to the above-stated expedient in the second aspect of performance, the conductor film formed by the identical manufacturing step is patterned thereby to simultaneously form the base lead-out electrode and the gate electrodes, so that a semiconductor integrated circuit device can be produced by a simple manufacturing process.

BRIEF DESCRIPTION OF THE DRAWINGS

FIGS. 15-24 are sectional views of essential portions showing the respective manufacturing steps of the bipolar-CMOS LSI of Embodiment V of the present invention.

DESCRIPTION OF THE PREFERRED EMBODIMENTS

Now, embodiments of the present invention will be concretely described with reference to the drawings.

By the way, throughout the drawings for elucidating the embodiments, parts having identical functions are assigned the same symbols, and they shall not be repeatedly explained.

Embodiment I

Figure 1:
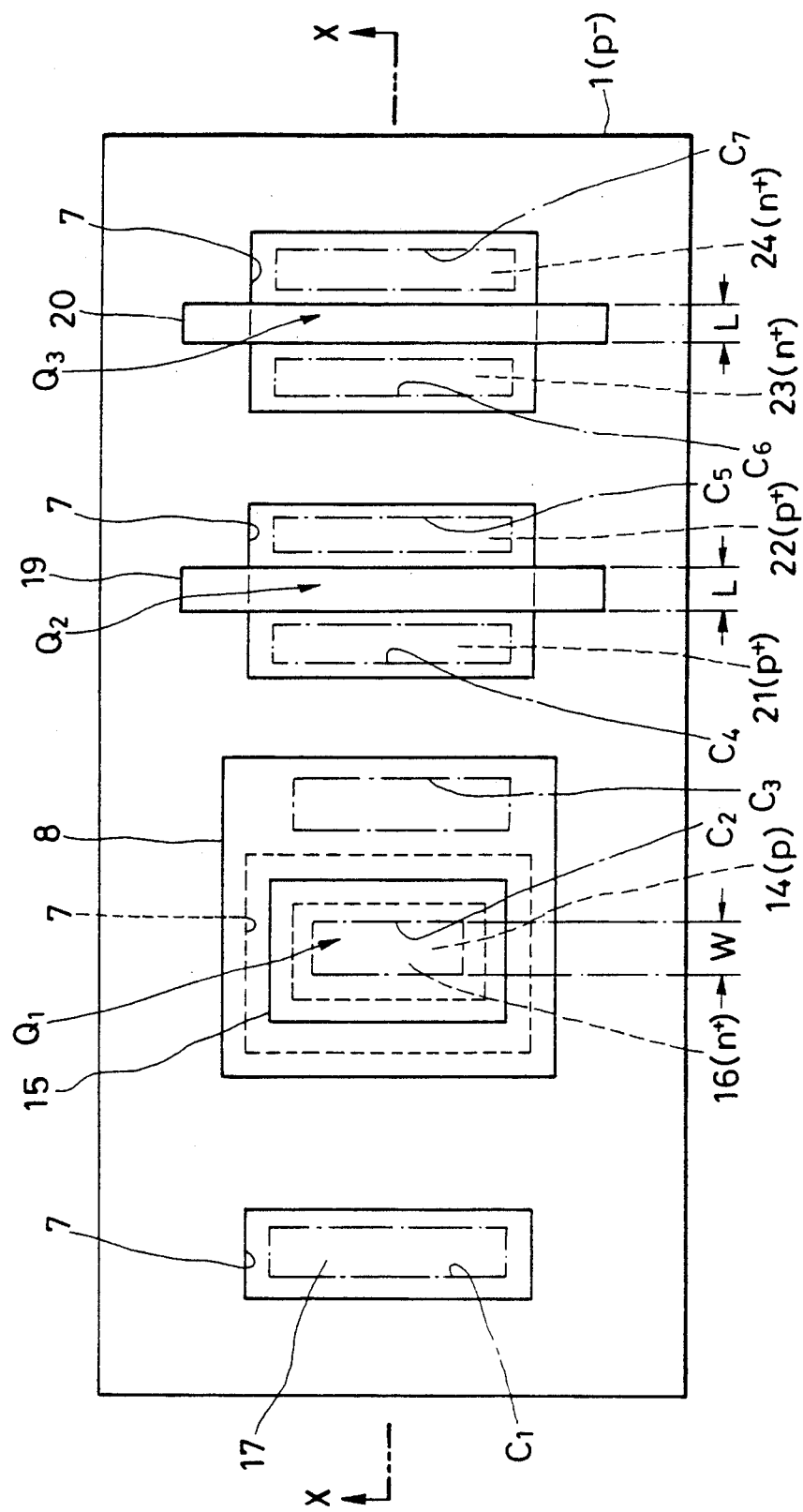
FIG. 1 is a plan view showing a bipolar-CMOS LSI according to Embodiment I of the present invention.
Figure 2:
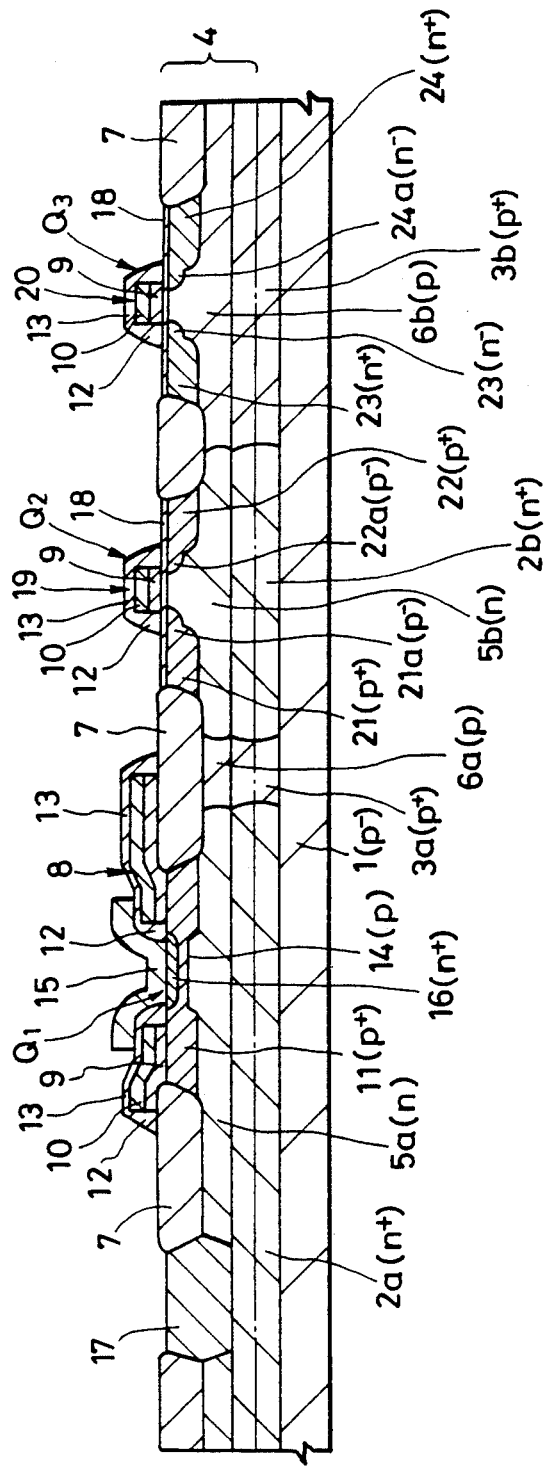
FIG. 2 is a sectional view taken along line X—X in FIG. 1.

FIG. 1 is a plan view illustrative of a bipolar-CMOS LSI according to Embodiment I of the present invention, while FIG. 2 is a sectional view taken along line X—X in FIG. 1.

As shown in FIGS. 1 and 2, in the bipolarCMOS LSI according to Embodiment I, buried layers 2a, 2b of, for example, n+-type and buried layers 3a, 3b of, for example, p+-type are provided in a semiconductor substrate 1, for example, p−-type silicon substrate. The maximum impurity concentration of the buried layers 2a, 2b is, for example, $1 \times 10^{19}$ /cm$^3$, while the maximum impurity concentration of the buried layers 3a, 3b is, for example, $1 \times 10^{17}$ /cm$^3$. In addition, an epitaxial layer 4, for example, silicon layer is provided on the semiconductor substrate 1. Incidentally, the surface of the semiconductor substrate 1 before the growth of the epitaxial layer 4 is indicated by a dot-and-dash line in FIG. 2. By way of example, n-wells 5a, 5b and p-wells 6a, 6b are provided in the epitaxial layer 4 so as to respectively correspond to the buried layers 2a, 2b and the buried layers 3a, 3b. The mean impurity concentration and depth of the n-wells 5a, 5b are, for example, $1 \times 10^{16}$ cm$^3$ and 1.0 μm, respectively. Similarly, the mean impurity concentration and depth of the p-wells 6a, 6b are, for example, $1 \times 10^{16}$ /cm$^3$ and 1.0 μm, respectively. A field insulator film 7, for example, SiO$_2$ film having a thickness of 0.5 μm is provided on the selected areas of the surface of the eptiaxial layer 4, whereby the isolation of the elements of the LSI is effected. A base lead-out electrode 8 extending on the field insulator film 7 is provided on that part of the surface of the n-well 5a which is enclosed with this field insulator film 7. By way of example, the base lead-out electrode 8 is composed of a p+-type polycrystalline silicon film (layer) 9 which is 0.1 μm thick and a refractory metal silicide film (layer) 10 which is provided thereon. Usable as the refractory metal silicide film (layer) 10 is any of a tungsten silicide (WSi$_2$)film, a molybdenum silicide (MoSi$_2$) film, a tantalum silicide (TaSi$_2$) film, a titanium silicide (TiSi$_2$) film, a platinum silicide (PtSi$_2$) film, etc. In a case where the WSi$_2$ film 0.15 μm thick, for example, is employed as the refractory metal silicide film (layer) 10, the sheet resistance thereof is as very low as about 5 Ω/□.

The base lead-out electrode 8 is connected to a graft base region 11 of, for example, p+-type which is formed in the n-well 5a by the diffusion of a p-type impurity from the p+-type polycrystalline silicon film 9. The depth of the graft base region 11 is, for example, 0.4 μm. A side wall (hereinbelow, also called "side wall spacer") 12 which is made of an insulator, for example, SiO$_2$ is provided on the side surface of the base lead-out electrode 8, and an insulator film 13, for example, SiO$_2$ film is provided on the electrode 8. The width of the side wall 12 is, for example, 0.3 μm.

Besides, an intrinsic base region 14 of, for example, p-type is provided in the n-well 5a in self-alignment to the base lead-out electrode 8 and in connection with the graft base region 11. The depth of the intrinsic base region 14 is, for example, 0.3 μm, and the sheet resistance thereof is, for example, about 900 Ω/□. Numeral 15 designates a polycrystalline silicon emitter electrode which is made of a polycrystalline silicon film of, for example, n+-type. Owing to the polycrystalline silicon emitter electrode 15, alloy pits (penetration pits) in the case of providing an aluminum electrode thereon can be prevented, so that enhancement in the reliability of the electrode can be achieved. In the intrinsic base region 14, an emitter region 16 of, for example, n+-type which is formed by the diffusion of an n-type impurity from the n+-type polycrystalline silicon film (layer) making the polycrystalline silicon emitter electrode 15 is provided in self-alignment to the side wall 12. The depth of the emitter region 16 is, for example, 0.2 μm. An n-p-n bipolar transitor $Q_1$ is constructed of the emitter region 16, the intrinsic base region 14, and a collector region which is formed of the nwell 5a underlying this intrinsic base region 14. In addition, numeral 17 indicates a collector take-out region of, for example, n+-type which is connected with the buried layer 2a.

As understood from the foregoing, according to the present embodiment, the bipolar transistor has the structure in which the periphery of the emitter region 16 is surrounded with the graft base region 11 with an outward extension smaller than the width of the side wall 12, and moreover, the sheet resistance of the base lead-out electrode 8 is very low, so that the base resistance of the bipolar transistor can be rendered very low. By way of example, in a case where the size of the emitter region 16 is $1 \times 5$ μm$^2$, the base resistance of the bipolar transistor in the prior-art bipolar-CMOS LSI already stated is about 500 Ω, whereas the base resistance can be remarkably lowered to about 130 Ω in accordance with the present embodiment. Thus, the higher operating speed of the n-p-n bipolar transistor $Q_1$ can be achieved. In addition, the base lead-out electrode 8 is formed simultaneously with gate electrodes 19, 20 to be described later, in such a way that the polycrystalline silicon film (layer) 9 and the refractory metal silicide film (layer) 10 are formed on the whole surface of a semiconductor body and are thereafter patterned. Thus, the number of manufacturing steps decreases to this extent, so that the simplification of the manufacturing process can be achieved.

Meanwhile, an insulator film 18, for example, SiO$_2$ film 250 Å thick is provided on those parts of the surfaces of the n-well 5b and p-well 6b which are enclosed with the field insulator film 7. The insulator film 18 is overlaid with the gate electrodes 19, 20 which are composed of, for example, the polycrystalline silicon film (layer) 9 of the n+-type and the refractory metal silicide film layer 10 provided thereon. As stated above, the gate electrodes 19, 20 are formed simultaneously with the base lead-out electrode 8. Side walls 12 and parts of the insulator film 13 are respectively provided on the side surfaces and upper surfaces of the gate electrodes 19, 20.

Within the n-well 5b, a source region 21 and a drain region 22 of, for example, p+-type are provided in self-alignment to the gate electrode 19. A p-channel MOSFET (MISFET) $Q_2$ is constructed of the gate electrode 19, the source region 21 and the drain region 22. Low impurity concentration portions 21a and 22a of, for example, p−-type are respectively provided in those parts of the source region 21 and the drain region 22 which underlie the end parts of the gate electrode 19. That is, the p channel MOSFET $Q_2$ has the so-called LDD structure in which an electric field in the vicinity of the drain region 22 is relaxed by the low impurity concentration portion 22a. The depth and mean impurity concentration of high impurity concentration portions in the source region 21 and drain region 22 are, for example, 0.4 μm and $2 \times 10^{20}$ /cm$^3$, respectively, while the depth and mean impurity concentration of the low impurity concentration portions 21a and 22a are, for example, 0.2 μm and $5 \times 10^{17}$ /cm$^3$, respectively.

Within the p-well 6b, a source region 23 and a drain region 24 of, for example, n+-type are provided in self-alignment to the gate electrode 20. An n-channel MOSFET (MISFET) $Q_3$ is constructed of the gate electrode 20, the source region 23 and the drain region 24. Low impurity concentration portions 23a and 24a of, for example, n−-type are respectively provided in those parts of the source region 23 and the drain region 24 which underlie the end parts of the gate electrode 20. Accordginly, likewise to the p-channel MOSFET $Q_2$ stated before, the n-channel MOSFET $Q_3$ has the LDD structure in which an electric field in the vicinity of the drain region 24 is relaxed by the low impurity concentration portion 24a. The depth and mean impurity concentration of high impurity concentration portions in the source region 23 and drain region 24 are, for example, 0.4 μm and $2 \times 10^{20}$ /cm$^3$, respectively, while the depth and mean impurity concentration of the low impurity concentration portions 23a and 24a are, for example, 0.2 μm and $5 \times 10^{17}$ /cm$^3$, respectively. The n-channel MOSFET $Q_3$ and the foregoing p-channel MOSFET $Q_2$ constitute CMOS transistors (complementary MISFETs). By the way, the p-channel MOSFET $Q_2$ and the n-channel MOSFET $Q_3$ need not always be brought into the LDD structures as stated above.

In actuality, an insulator film for passivation is provided so as to cover the n-p-n bipolar transistor $Q_1$, p-channel MOSFET $Q_2$ and n-channel MOSFET $Q_3$, and aluminum wiring, for example, is provided on the insulator film. However, the insulator film and the aluminum wiring are omitted from illustration, and only contact holes $C_1$-$C_7$ are shown in FIG. 1.

The refractory metal silicide film (layer) 10 may well be replaced with a refractory metal film of, for example, W or Mo. In addition, the base lead-out electrode 8 and the gate electrodes 19, 20 may well be made of only the refractory metal silicide film (layer) 10 or the refractory metal film. Further, in order to regulate the threshold voltages of the p-channel MOSFET $Q_2$ and n-channel MOSFET $Q_3$, a p+-type polycrystalline silicon film (layer) may well be employed instead of the n+-type polycrystalline silicon film 9 constituting the gate electrodes 19, 20.

Next, there will be described an example of a method of manufacturing the bipolar-CMOS LSI according to Embodiment I constructed as stated above.

Figure 3:
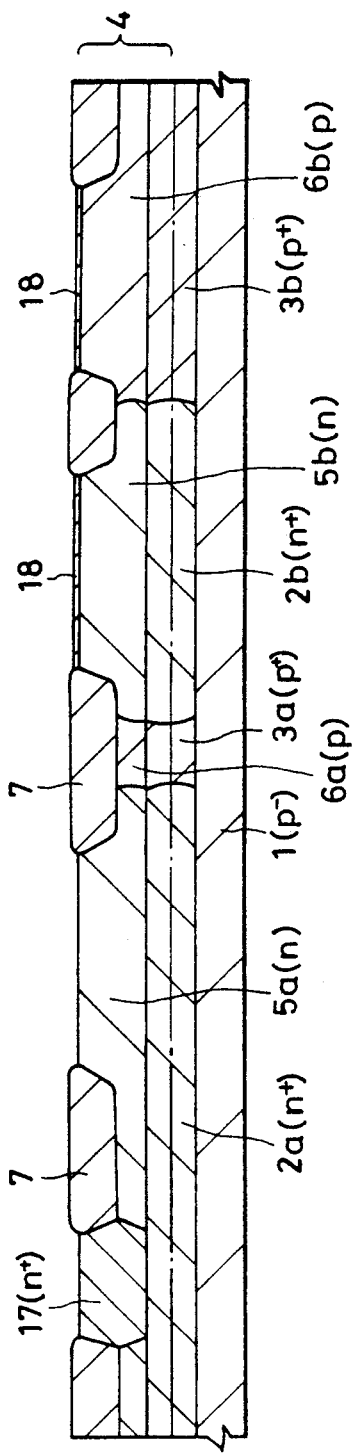
FIGS. 3-8 are sectional views for explaining in the order of steps, a method of manufacturing the bipolar-CMOS LSI shown in FIGS. 1 and 2.

As shown in FIG. 3, buried layers 2a, 2b, 3a, 3b are first formed in a semiconductor substrate 1 by ion implantation, diffusion or the like, whereupon an epitaxial layer 4 is formed on the semiconductor substrate 1 by, for example, epitaxial growth. Subsequently, an n-type impurity and a p-type impurity, for example, are respectively ion-implanted into the epitaxial layer 4, thereby to form n-wells 5a, 5b and p-wells 6a, 6b. Next, a field insulator film 7 is formed on the surface of the epitaxial layer 4 by, for example, local oxidation. At the next step, a collector take-out region 17 is formed in such a way that an n-type impurity, for example, phosphorus is introduced into the selected part of the n-well 5a by the ion implantation, diffusion or the like of the n-type impurity. Subsequently, an insulator film 18 is formed by, for example, thermal oxidation on the surfaces of the n-wells 5a, 5b and p-wells 6a, 6b enclosed with the field insulator film 7. Subsequently, only the part of the insulator film 18 formed on the surface of the n-well 5a is selectively etched and removed.

Figure 4:
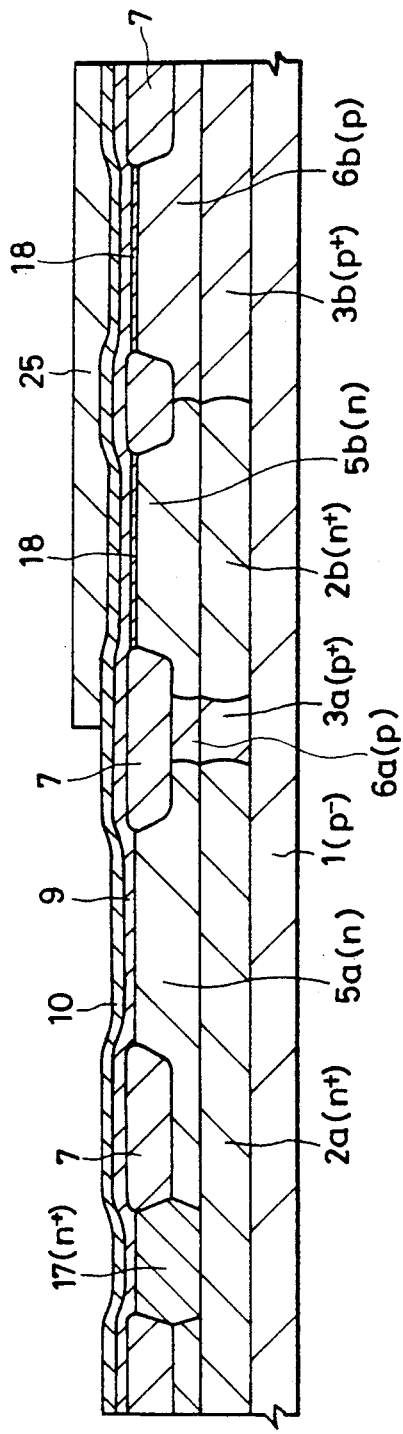

Next, as shown in FIG. 4, a polycrystalline silicon film 9 is formed on the whole surface of the resultant semiconductor body by, for example, CVD (Chemical Vapor Deposition). The polycrystalline silicon film 9 except its part to become a base lead-out electrode 8 later is selectively doped with an n-type impurity, for example, arsenic by ion implantation or the like beforehand. Subsequently, a refractory metal silicide film 10 is formed on the whole surface by, for example, CVD, whereupon a photoresist film 25 in a predetermined shape is formed on the refractory metal silicide film 10. Subsequently, using the photoresist film 25 as a mask, a p-type impurity, for example, boron is ion-implanted into the polycrystalline silicon film 9 and the refractory metal silicide film 10. The ion implantation is carried out under the conditions of an implantation energy level of 10 keV and a dose of $5 \times 10^{15}$ /cm² by way of example. Thereafter, the photoresist film 25 is removed. The ion implantation of the p-type impurity (boron) may well be conducted before the formation of the refractory metal silicide film 10.

Figure 5:
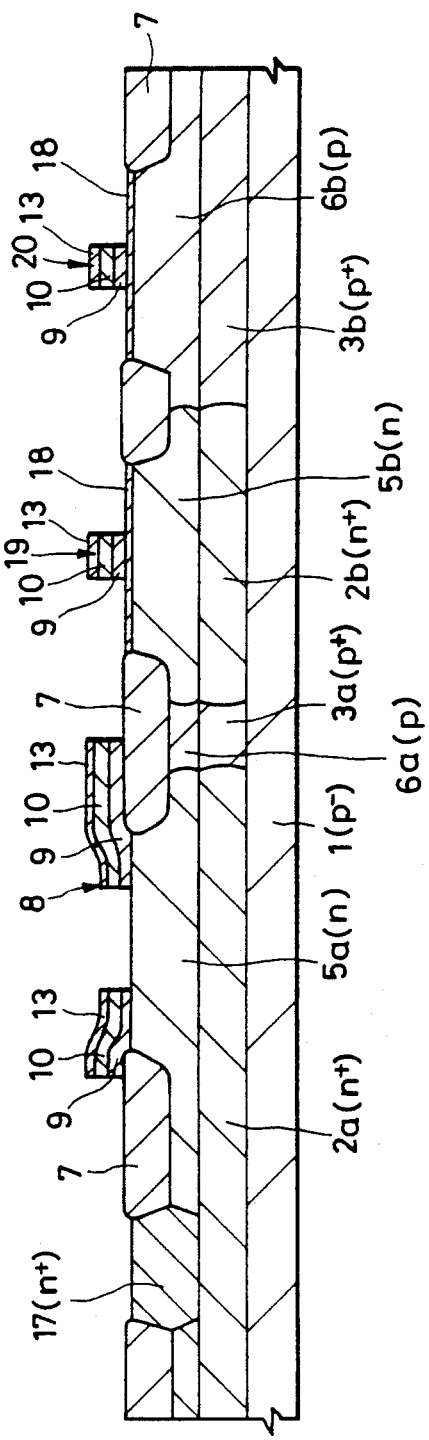

Next, as shown in FIG. 5, an insulator film 13 having a thickness of, for example, 0.3 μm is formed on the refractory metal silicide film 10 by, for example, CVD. Thereafter, the insulator film 13, refractory metal silicide film 10 and polycrystalline silicon film 9 are successively patterned by anisotropic etching, for example, reactive ion etching (RIE), thereby to form the base lead-out electrode 8 and gate electrodes 19, 20. Thus, the base lead-out electrode 8 and the gate electrodes 19, 20 can be simultaneously formed. That is, the base lead-out electrode 8 and the gate electrodes 19, 20 can be constructed of the same conductor film (composed of the polycrystalline silicon film 9 and the refractory metal silicide film 10) formed by an identical step of fabrication. In addition, the step of determining an emitter width W and the step of determining a gate length L, which are the most important steps in processes for manufacturing a bipolar transistor and MISFETs, can be simultaneously performed by one etching step. The reason is that the step of patterning the base lead-out electrode 8 defines the emitter width W together with a side wall 12 which is formed by a later step. By way of example, the side wall 12 is formed in such a way that an insulator film such as $SiO_2$ film is formed on the whole surface by CVD and is thereafter etched anisotropically in a direction perpendicular to the surface of the substrate by RIE. Herein, the length of the side wall 12 parallel to the substrate is determined substantially by the thickness of the insulator film which has been deposited by the CVD.

Figure 6:
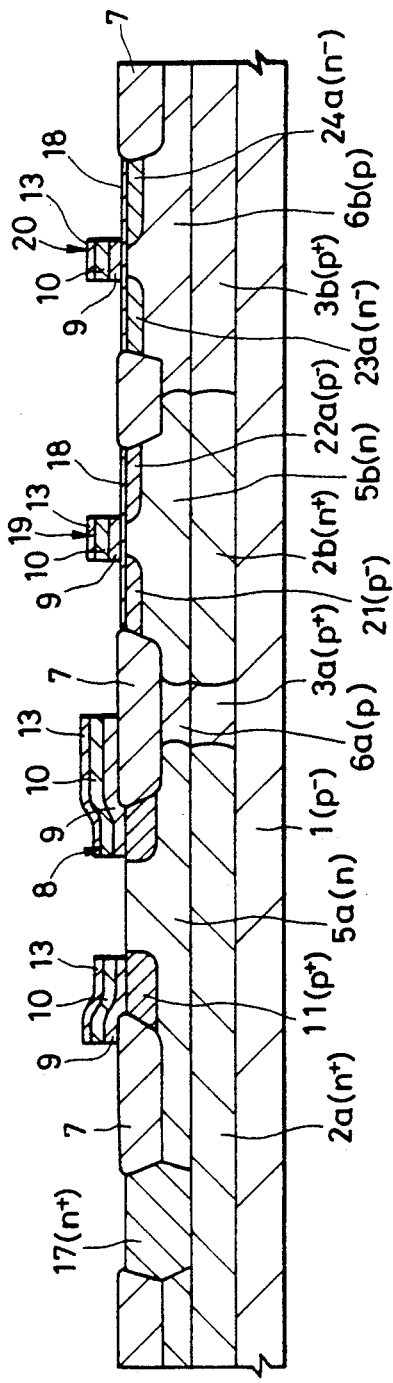

Next, as shown in FIG. 6, using the gate electrode 20 as a mask, an n-type impurity, for example, phosphorus is ion-implanted into the selected parts of the p-well 6b under the conditions of, for example, an implantation energy level of 60 keV and a dose of $1 \times 10^{13}$ /cm², thereby to form low impurity concentration portions 23a, 24a. Subsequently, likewise to the above, using the gate electrode 19 as a mask, a p-type impurity, for example, boron is ion-implanted into the selected parts of the n-well 5b under the conditions of, for example, an implantation energy level of 30 keV and a dose of $1 \times 10^{13}$ /cm², thereby to form low impurity concentration portions 21a, 22a. Thereafter, the resultant semiconductor body is heat-treated at 900° C. for 10 minutes by way of example, whereby the p-type impurity in the base lead-out electrode 8 is diffused into the n-well 5a so as to form a graft base region 11, and at the same time, the ion-implanted impurities are electrically activated.

Figure 7:
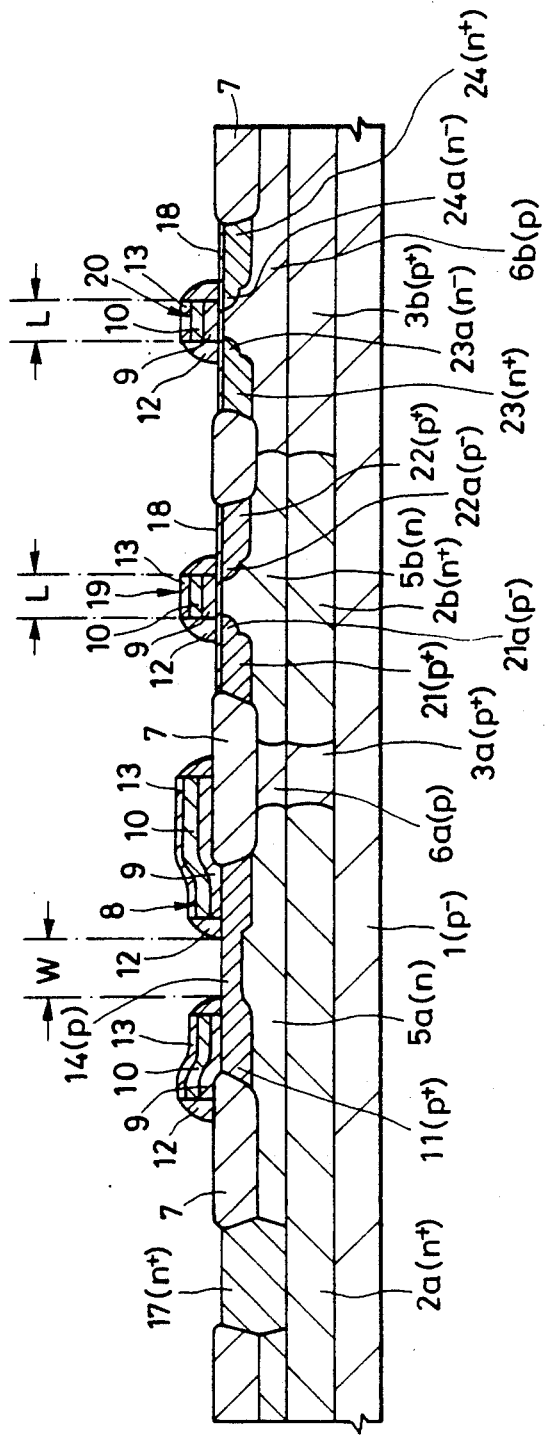

Subsequently, an insulator film, for example, $SiO_2$ film 0.4 μm thick is formed on the whole surface by, for example, CVD and is anisotropically etched in the direction perpendicular to the surface of the substrate by, for example, RIE, whereby side walls 12 are formed on the side surfaces of the base lead-out electrode 8 and the gate electrodes 19, 20 as shown in FIG. 7. At the next step, using the side wall 12 as a mask, an n-type impurity, for example, arsenic is ion-implanted into the selected parts of the p-well 6b under the conditions of, for example, an implantation energy level of 80 keV and a dose of $5 \times 10^{15}$ /cm², whereby a source region 23 and a drain region 24 are formed in self-alignment to this side wall 12. Next, using the side wall 12 as a mask, a p-type impurity, for example, boron is ion-implanted into the selected parts of the n-well 5b under the conditions of, for example, an implantation energy level of 30 keV and a dose of $2 \times 10^{15}$ /cm², whereby a source region 21 and a drain region 22 are formed in self-alignment to this side wall 12. Subsequently, using the side wall 12 as a mask, a p-type impurity, for example, boron is ion-implanted into the selected part of the n-well 5a under the conditions of, for example, an implantation energy level of 10 keV and a dose of $1 \times 10^{14}$ /cm², whereby an intrinsic base region 14 is formed in self-alignment to this side wall 12.

Figure 8:
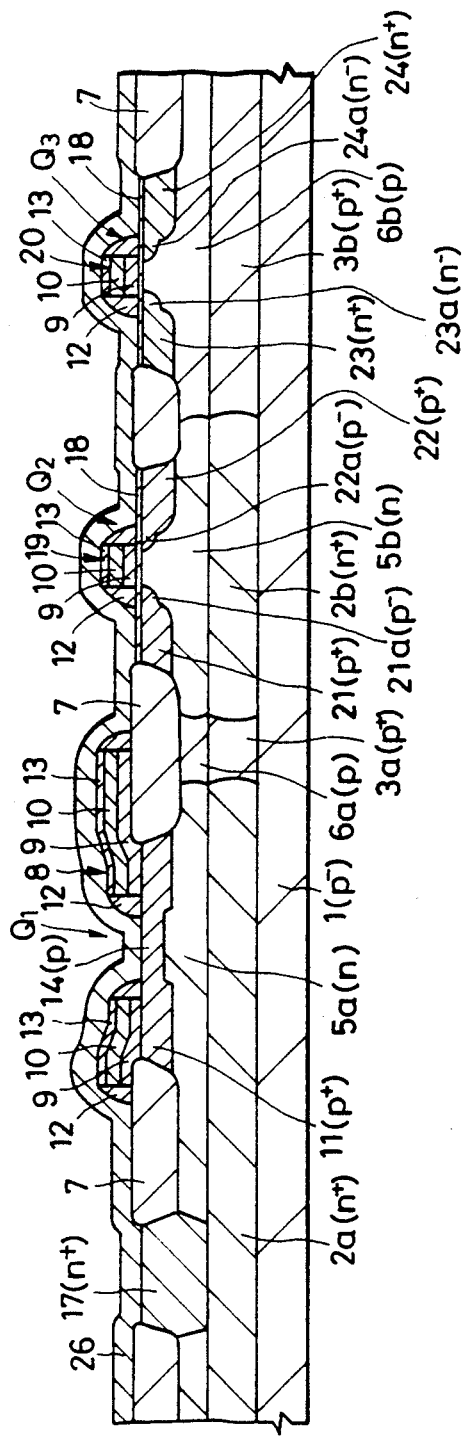

Next, as shown in FIG. 8, a polycrystalline silicon film 26 having a thickness of 0.15 μm by way of example is formed on the whole surface of the resultant semiconductor body by, for example, CVD and is thereafter ion-implanted with an n-type impurity, for example, arsenic under the conditions of, for example, an implantation energy level of 80 keV and a dose of $1.5 \times 10^{16}$ /cm².

Subsequently, a heat treatment is conducted at 950° C. for 20 minutes by way of example, to diffuse the n-type impurity in the polycrystalline silicon film 26 into the intrinsic base region 14, whereby an emitter region 16 is formed in self-alignment to the side wall 12 as shown in FIG. 2. Subsequently, the polycrystalline silicon film 26 is patterned by etching so as to form a polycrystalline silicon emitter electrode 15. The depth of the emitter region 16 under this state is, for example, 0.1 μm; that of the intrinsic base region 14 is, for example, 0.25 μm; that of the graft base region 11 is, for example, 0.4 μm; and all the depths of the source region 21 and drain region 22 of the p-channel MOSFET $Q_2$ and the source region 23 and drain region 24 of the n-channel MOSFET $Q_3$ are, for example, 0.4 μm.

Thereafter, an insulator film for passivation (not shown) is formed on the whole surface of the resultant semiconductor body and is formed with contact holes $C_1$–$C_7$. Subsequently, an aluminum film, for example, is formed on the whole surface and is patterned by etching so as to form predetermined wiring (not shown). Then, the bipolar-CMOS LSI as intended is finished up.

According to the manufacturing method described above, the CMOS transistors and the n-p-n bipolar transistor $Q_1$ of high operating speed having the emitter region 16 provided in self-alignment to the base lead-out electrode 8 can be formed on the identical semiconductor substrate 1 by the simple fabricating steps.

Embodiment II

Figure 9:
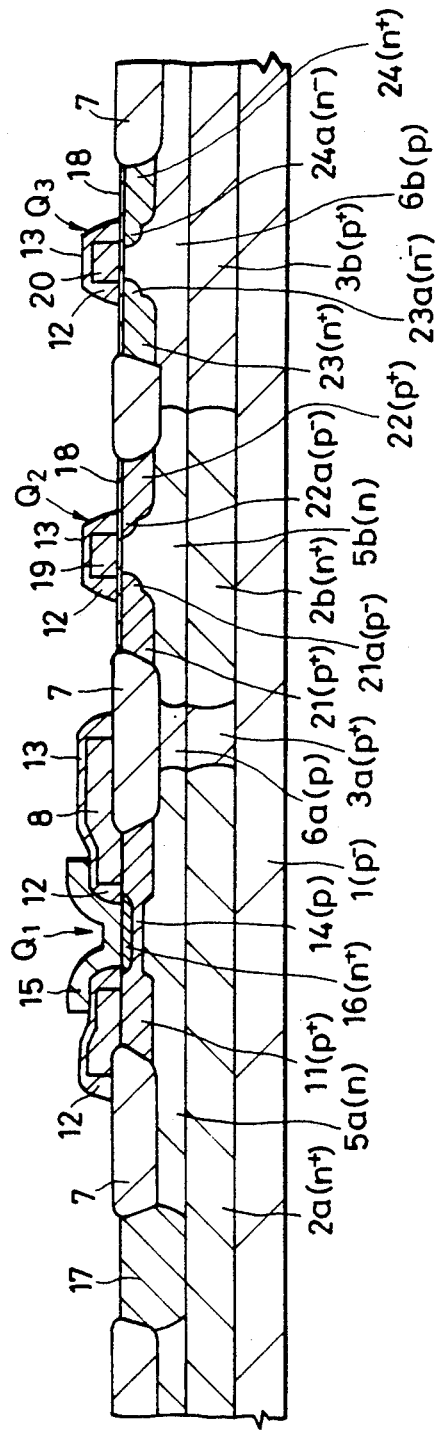
FIG. 9 is a sectional view showing a bipolar-CMOS LSI according to Embodiment II of the present invention.

FIG. 9 is a sectional view illustrative of a bipolar-CMOS LSI according to Embodiment II of the present invention. By the way, a plan view of the bipolar-CMOS LSI according to Embodiment II is similar to FIG. 1.

As shown in FIG. 9, the bipolar-CMOS LSI according to Embodiment II has substantially the same construction as that of the bipolar-CMOS LSI according to Embodiment I, except that a base lead-out electrode 8 and gate electrodes 19, 20 are made of only polycrystalline silicon films which are doped with p-type and n-type impurities and have sheet resistances of, for example, 200 $\Omega/\square$ and 30 $\Omega/\square$ respectively. The base lead-out electrode 8 and the gate electrodes 19, 20 are simultaneously formed in such a way that the same polycrystalline silicon film formed by an identical manufacturing step is subjected to impurity dopings and is then patterned. Thus, the simplification of the manufacturing process can be achieved likewise to Embodiment I.

A method of manufacturing the bipolar-CMOS LSI according to Embodiment II is similar to the method explained as to Embodiment I, except that the refractory metal silicide film 10 is not formed.

Embodiment III

Figure 10:
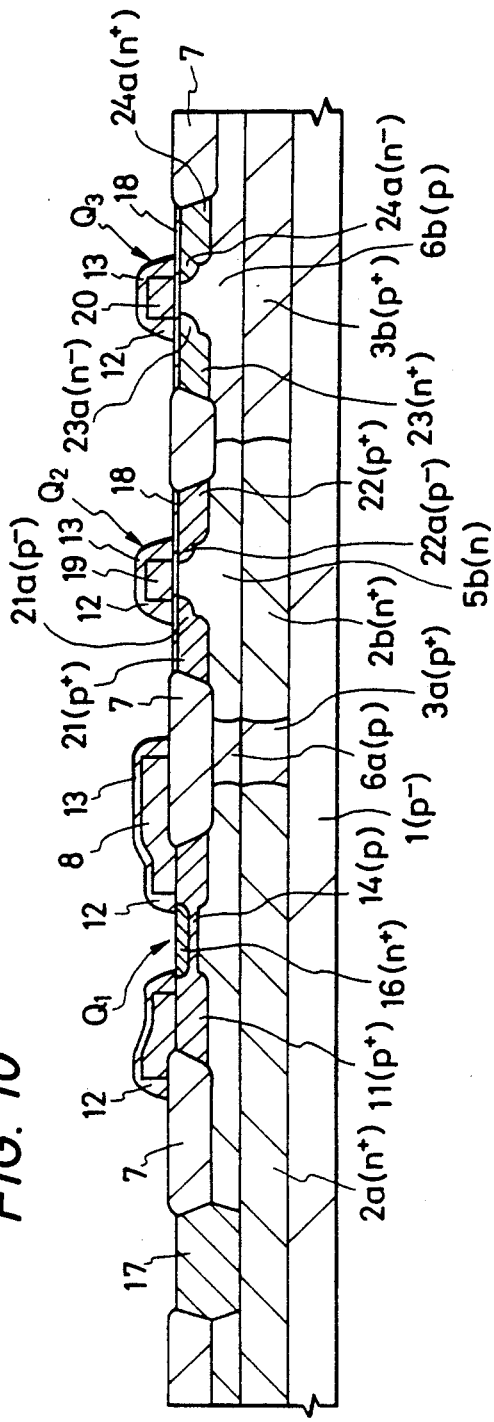
FIG. 10 is a sectional view showing a bipolar-CMOS LSI according to Embodiment III of the present invention.

FIG. 10 is a sectional view illustrative of a bipolar-CMOS LSI according to Embodiment III of the present invention. By the way, a plan view of the bipolar-CMOS LSI according to Embodiment III is similar to FIG. 1.

As shown in FIG. 10, the bipolar-CMOS LSI according to Embodiment III has substantially the same construction as that of the bipolar-CMOS LSI according to Embodiment I, except that a base lead-out electrode 8 and gate electrodes 19, 20 are made of only polycrystalline silicon films which are doped with p-type and n-type impurities and have sheet resistances of, for example, 200 $\Omega/\square$ and 30 $\Omega\square$, respectively, and that an emitter region 6 is formed by the ion implantation of an n-type impurity employing a side wall 12 as a mask, or the like. As in Embodiment II, the base lead-out electrode 8 and the gate electrodes 19, 20 are simultaneously formed in the way that the same polycrystalline silicon film formed by an identical manufacturing step is subjected to impurity dopings and is then patterned. Thus, the simplification of the manufacturing process can be achieved likewise to Embodiments I and II.

A method of manufacturing the bipolar-CMOS LSI according to Embodiment III is similar to the method explained as to Embodiment I, except that the refractory metal silicide film 10 is not formed and that the emitter region 16 is formed by the ion implantation of the n-type impurity employing the side wall 12 as the mask, or the like.

Embodiment IV

Figure 11:
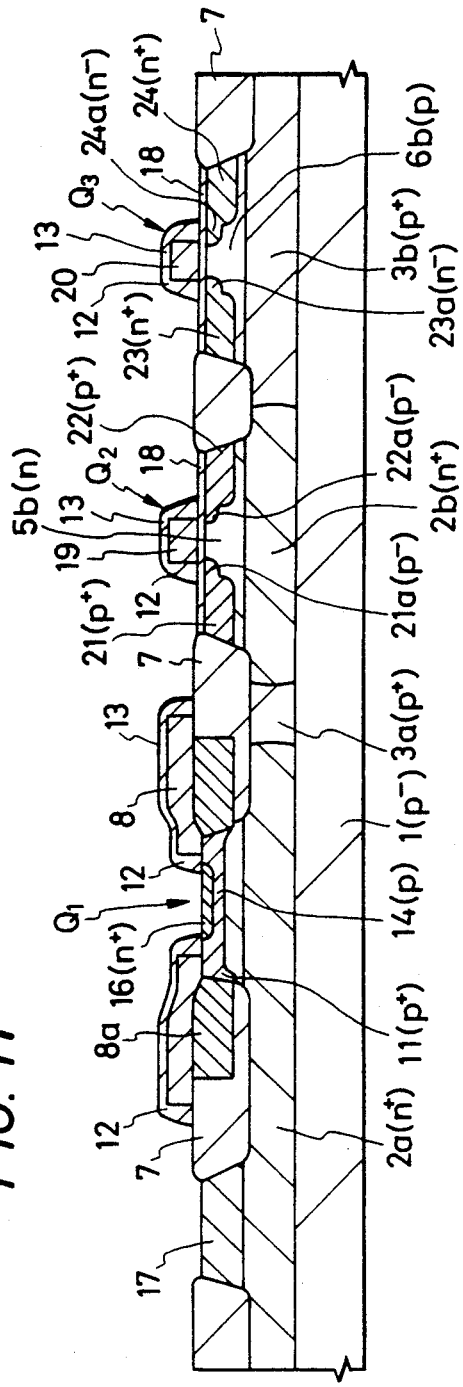
FIG. 11 is a sectional view showing a bipolar-CMOS LSI according to Embodiment IV of the present invention.

FIG. 11 is a sectional view illustrative of a bipolar-CMOS LSI according to Embodiment IV of the present invention.

As shown in FIG. 11, in the bipolar-CMOS LSI according to Embodiment IV, an n-p-n bipolar transistor $Q_1$ has a structure which is called SICOS (Sidewall Base Contact Structure). More specifically, in the n-p-n bipolar transistor $Q_1$ of the SICOS, a base lead-out electrode 8a made of a polycrystalline silicon film of, for example, $p^+$-type is provided on a field insulator film 7. This base lead-out electrode 8a is structurally connected to the side wall of a graft or extrinsic base region 11. Thus, the bipolar transistor can have its base resistance lowered and have the area of its base region reduced. Besides, the base lead-out electrode 8a is overlaid with a base lead-out electrode 8 which is formed simultaneously with gate electrodes 19, 20 in such a way that the same polycrystalline silicon film formed by an identical manufacturing step is patterned. Owing to this base lead-out electrode 8, the base resistance can be lowered more. Accordingly, the n-p-n bipolar transistor $Q_1$ of ultra-high speed and CMOS transistors can be formed on an identical semiconductor substrate 1. Incidentally, the n-p-n bipolar transistor of the aforementioned structure SICOS is stated in, for example, "IEDM 1986, Technical Digest," pp. 472-475 or the official gazette of Japanese Patent Application Laid-open No. 1556/1981.

In case of manufacturing the bipolar-CMOS LSI according to Embodiment IV, the manufacturing steps illustrated in FIG. 3 et seq. may be carried out after the base lead-out electrode 8a characteristic of the structure SICOS has been formed beforehand by, for example, the same method as described in the above official gazette of Japanese Patent Application Laid-open No. 1556/1981.

Embodiment V

Embodiment V of the present invention consists in a bipolar-CMOS LSI well suited to heighten the density of integration, which has improved the foregoing embodiment I of the bipolar-CMOS LSI upon the inventor's further study on Embodiment I.

Before the description of Embodiment V, the reason why the inventor has bettered Embodiment I will be stated below:

The inventor studied the bipolar-CMOS LSI explained as Embodiment I. As a result, it has been found out that, as the density of integration is heightened, the short channel effect of the p-channel MISFET becomes conspicuous. Since the p-channel MISFET is formed of the n-type gate electrode, the work function difference between the substrate and the gate electrode with reference to the substrate side becomes small. This work function difference is −0.2 to −0.3 [V]. The threshold voltage ($V_{th}$) of the p-channel MISFET as required for circuitry is about −0.5 [V] though it differs depending upon the kinds of circuits. In order to attain the above threshold voltage, the p-channel MISFET must have the effective impurity concentration of the channel forming region thereof lowered in such a way that the p-type impurity (B) for adjusting the threshold voltage is introduced into the n-type channel forming region in large amounts. In the p-channel MISFET, therefore, depletion regions extending from both the source region and drain region toward the channel forming region lengthen to render the short channel effect conspicuous as stated above. In consequence, reduction in the dimension of the p-channel MISFET in the channel length (gate length) direction thereof is limited, so the bipolar-CMOS LSI poses the problem that a high density of integration cannot be achieved.

In order to solve the aforementioned problem, in the bipolar-CMOS LSI of Embodiment I, the n-channel MISFET of the CMOS transistors is constructed of an n-type gate electrode, and the p-channel MISFET is constructed of a p-type gate electrode. Owing to this construction, the p-channel MISFET can have the short channel effect prevented by enlarging the work function difference between the substrate and the gate electrode with reference to the substrate side and heightening the impurity concentration of the channel forming region, so that the occupation area thereof can be reduced. As a result, the high density of integration of the bipolar-CMOS LSI can be achieved.

Now, Embodiment V of the present invention will be described in detail.

Figure 13:
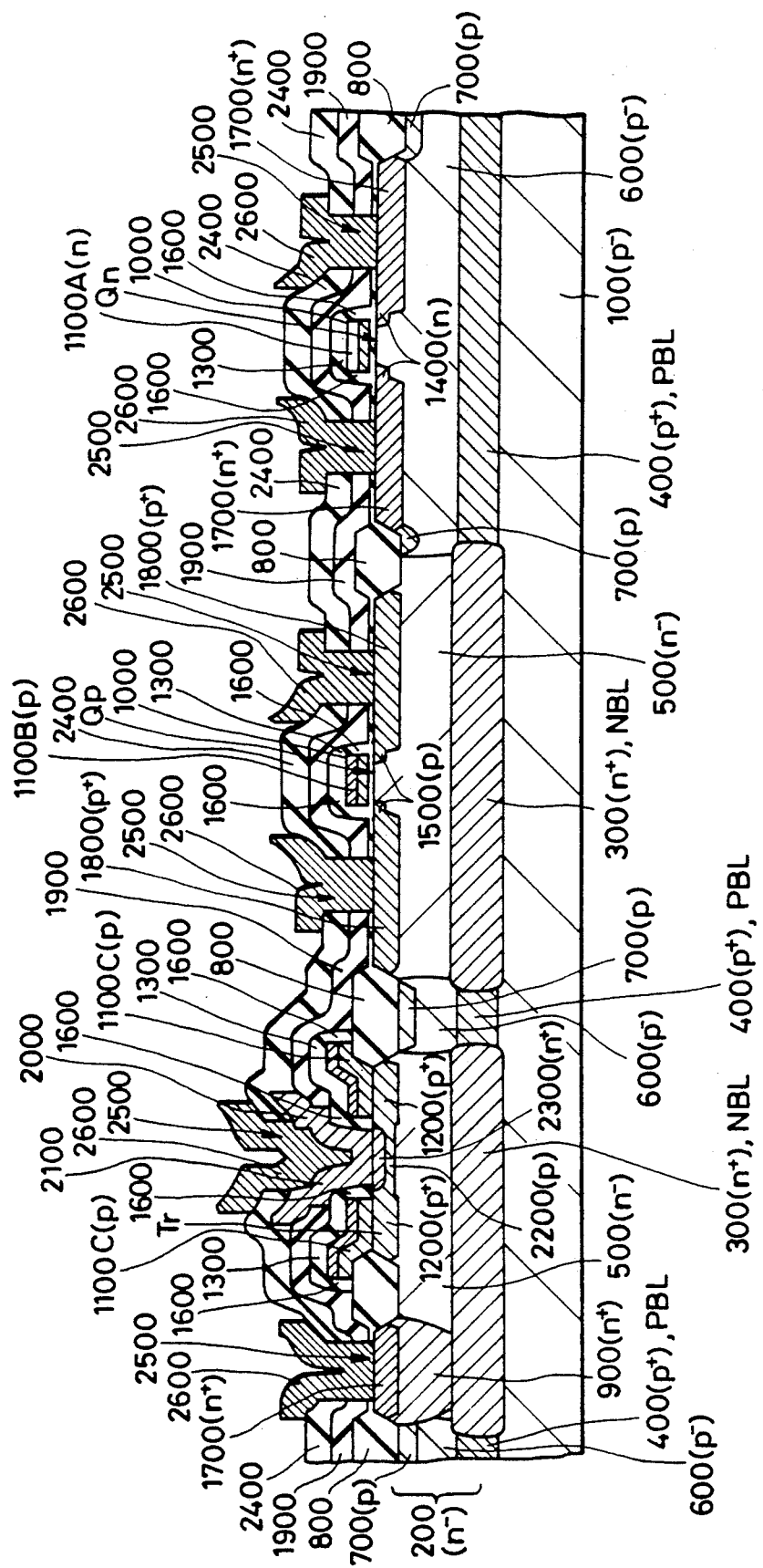
FIG. 13 is a sectional view of the essential portions of a bipolar-CMOS LSI which is Embodiment V of the present invention.

As shown in FIG. 13, the bipolar-CMOS LSI is such that semiconductor elements are constructed on the principal surface of an $n^-$-type epitaxial layer 200 which is stacked on the principal surface of a p⁻-type semiconductor substrate 100 made of single-crystal silicon. The p-channel MISFET $Q_p$ of CMOS transistors has its region defined and is electrically isolated from the other regions mainly by an element isolating insulator film 800. The n-channel MISFET $Q_n$ of the CMOS transistors has its region defined and is electrically isolated from the other regions mainly by the element isolating insulator film 800 and a p-type channel stopper region 700. The bipolar transistor Tr of the LSI has its region defined and is electrically isolated from the other regions mainly by an isolation region which is formed of the semiconductor substrate 100, the element isolating insulator film 800, the p-type channel stopper region 700, a p⁻-type well region 600 and a p⁺-type buried semiconductor layer (PBL) 400.

The n-p-n bipolar transistor Tr is constructed of an n-type collector region, a p-type base region and an n-type emitter region.

The collector region is composed of an n⁺-type buried semiconductor layer (NBL) 300, an n⁻-type well region 500, an n⁺-type semiconductor region (potential raising collector region) 900 and an n⁺-type semiconductor region 1700. The buried semiconductor layer 300 is formed in order to lower the collector resistance of this collector region.

The base region is composed of a p⁺-type semiconductor region (graft base region) 1200 and a p-type semiconductor region (intrinsic base region) 2200 which are provided in the principal surface part of the well region 500.

The emitter region is formed of an n⁺-type semiconductor region 2300.

The collector region of the bipolar transistor Tr has collector lead-out wiring 2600 connected to the semiconductor region 1700. The wiring 2600 is connected to the semiconductor region 1700 through a contact hole 2500 which is formed in inter-layer insulator films 1900 and 2400. The wiring 2600 is formed by the step of forming first-layer wiring, and it is made of, for example, an aluminum film with or without an additive (Cu or Si).

The base region has a base lead-out electrode 1100C connected to the semiconductor region 1200. The base lead-out electrode 1100C is connected to the semiconductor region 1200 through a contact hole which is not assigned a symbol but which is formed by removing an insulator film corresponding to the gate insulator films 1000 of the MISFETs $Q_n$ and $Q_p$. The base lead-out electrode 1100C is made of a composite film in which a refractory metal silicide ($WSi_2$, $MoSi_2$, $TaSi_2$ or $TiSi_2$) film is formed on a polycrystalline silicon film. The polycrystalline silicon film is doped (or diffused) with a p-type impurity (B) for lowering the resistance thereof. Alternatively, the base lead-out electrode 1100C may well be formed of a single layer made of a polycrystalline silicon film (p-type). The base lead-out electrode 1100C is formed by the step of forming first-layer gate wiring. The step of forming the first-layer gate wiring is adapted to form, besides the base lead-out electrode 1100C, both the gate electrode 1100A of the n-channel MISFET $Q_n$ and the gate electrode 1100B of the p-channel MISFET $Q_p$ to be described later.

The semiconductor region 2300 being the emitter region has emitter lead-out wiring 2600 connected thereto through an emitter lead-out electrode 2100. The emitter lead-out electrode 2100 is connected to the semiconductor region 2300 through a contact hole 2000 which is formed in the inter-layer insulator film 1900 and a contact hole (assigned no symbol) which is defined by a side wall spacer 1600 formed on the side wall of the base lead-out electrode 1100C. The emitter lead-out electrode 2100 is formed of, for example, a polycrystalline silicon film doped with an n-type impurity. This emitter lead-out electrode 2100 is formed by the step of forming second-layer gate wiring. An SRAM (Static type Random Access Memory) is built in the bipolar-CMOS LSI of the present embodiment though not shown, and the step of forming the second-layer gate wiring is adapted to form, besides the emitter lead-out electrode 2100, the high-resistance load elements and power source wiring of the memory cells of the SRAM. The emitter lead-out wiring 2600 is connected to the emitter lead-out electrode 2100 through a contact hole 2500 which is formed in the inter-layer insulator film 2400. This emitter lead-out wiring 2600 is formed by the step of forming the first-layer wiring.

The n-channel MISFET $Q_n$ of the CMOS transistors is formed in the principal surface of a p⁻-type well region 600, and it is constructed of the well region 600, the gate insulator film 1000, the gate electrode 1100A, and a pair of n-type semiconductor regions 1400 and a pair of n⁺-type semiconductor regions 1700 which constitute a source region and a drain region.

The well region 600 constructs the channel forming region of the MISFET $Q_n$. This well region 600 is formed at an impurity concentration of, for example, $10^{16}$–$10^{17}$ [atoms/cm²] or so. It is underlaid with a p⁺-type buried semiconductor layer 400 for lowering the resistance thereof.

By way of example, the gate insulator film 1000 is made of a silicon oxide ($SiO_2$) film formed by oxidizing the principal surface of the well region 600 and is formed to a thickness of about 200 [Å].

The gate electrode 1100A is made of the same conductor film as that of the base lead-out electrode 1100C, namely, the composite film in which the refractory metal silicide film is formed on the polycrystalline silicon film. The polycrystalline silicon film of the gate electrode 1100A is doped (or diffused) with an n-type impurity and is thus rendered the n-type.

Each semiconductor region 1400 of low impurity concentration is connected to the channel forming region side of the corresponding semiconductor region 1700 of high impurity concentration. The semiconductor regions 1400 of the low impurity concentration constitute the MISFET $Q_n$ having a so-called LDD (Lightly Doped Drain) structure. These semiconductor regions 1400 of the low impurity concentration are constructed in such a way that an n-type impurity (for example, P) is introduced by ion implantation in which the gate electrode 1100A or the overlying insulator film 1300 is mainly employed as an impurity introducing mask. They are formed in self-alignment to the gate electrode 1100A.

The semiconductor regions 1700 of the high impurity concentration are constructed in such a way that an n-type impurity (for example, As) is introduced by ion implantation in which a side wall spacer 1600 formed on the side wall of the gate electrode 1100A is mainly employed as an impurity introducing mask. These semiconductor regions 1700 of the high impurity concentration are formed in self-alignment to the gate electrode 1100A because the side wall spacer 1600 is constructed in self-alignment to this gate electrode 1100A.

Each semiconductor region 1700 being the source region or drain region of the MISFET $Q_n$ has wiring 2600 connected thereto through a contact hole 2500 which is formed in the inter-layer insulator films 1900 and 2400. This wiring 2600 is made of the same conductor film as that of the collector lead-out wiring 2600 and the emitter lead-out wiring 2600.

The p-channel MISFET $Q_p$ of the CMOS transistors is formed in the principal surface of an n⁻-type well region 500, and it is constructed of the well region 500, the gate insulator film 1000, the gate electrode 1100B, and a pair of p-type semiconductor regions 1500 and a pair of p⁺-type semiconductor regions 1800 which constitute a source region and a drain region.

The well region 500 constructs the channel forming region of the MISFET $Q_p$. This well region 500 is formed at an impurity concentration of, for example, $10^{15}$–$10^{17}$ [atoms/cm²] or so. Likewise to the well region 600, the well region 500 is underlaid with an n⁺-type buried semiconductor layer 300 for lowering the resistance thereof.

The gate insulator film 1000 is formed by a manufacturing step identical to that of the foregoing gate insulator film 1000 of the MISFET $Q_n$.

The gate electrode 1100B is made of the same conductor film layer as that of the base lead-out electrode 1100C and the gate electrode 1100A, namely, the composite film in which the refractory metal silicide film layer is formed on the polycrystalline silicon film. This polycrystalline silicon film layer is doped (or diffused) with a p-type impurity opposite in the conductivity type to the impurity introduced into the polycrystalline silicon film of the gate electrode 1100A, and is thus rendered the p-type.

The semiconductor regions 1500 of low impurity concentration constitute the MISFET $Q_p$ of LDD structure. Likewise to the semiconductor regions 1400 of the low impurity concentration, the semiconductor regions 1500 of the low impurity concentration are formed in self-alignment to the gate electrode 1100B. The semiconductor regions 1800 of high impurity concentration are formed in self-alignment to the gate electrode 1100B through a side wall spacer 1600.

Each semiconductor region 1800 being the source region or drain region of the MISFET $Q_p$ has wiring 2600 connected thereto through a contact hole 2500 which is formed in the inter-layer insulator films 1900 and 2400.

In the bipolar-CMOS LSI thus constructed, as stated before, the n-channel MISFET $Q_n$ of the CMOS transistors includes the n-type gate electrode 1100A, and the p-channel MISFET $Q_p$ includes the p-type gate electrode 1100B. A formula for evaluating the threshold voltage $V_{th}$ of the MISFET will be indicated below. As understood from the formula, the quantity $Q_c$ of the introduction of a threshold voltage adjusting impurity into the channel forming region (well region 500) can be varied by constructing the p-channel MISFET $Q_p$ out of the p-type gate electrode 1100B.

$$V_{th} = \phi_{MS} + 2\phi_F = \frac{Q_{SS}}{C_{OX}} - \frac{Q_B}{C_{OX}} + \frac{Q_C}{C_{OX}} \quad (1)$$

where $\phi_{MS}$: work function between the substrate and the gate electrode, $\phi_F$: Fermi energy level of the substrate, $Q_{SS}$: surface charge density, $C_{OX}$: capacitance of the gate insulator film, $Q_B$: substrate charges, $Q_C$: quantity of the introduction of the impurity into the channel forming region.

Figure 14:
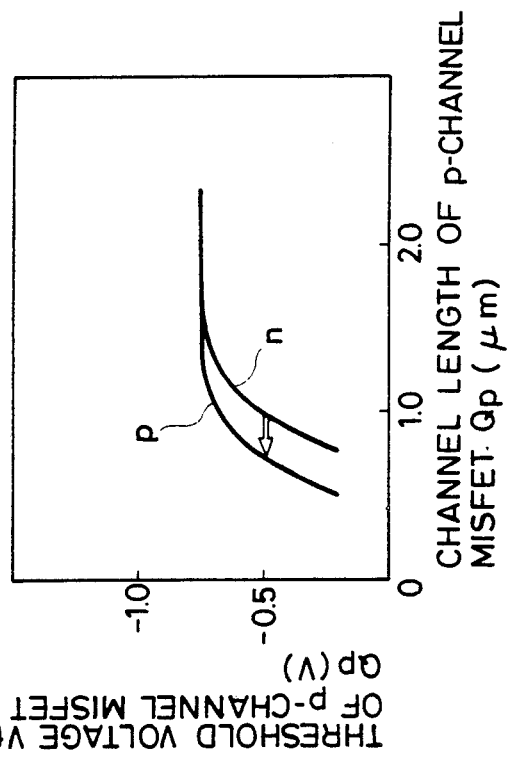
FIG. 14 is a diagram for explaining the effect of Embodiment V of the present invention.

More specifically, in the case where the gate electrode 1100B of the p-channel MISFET $Q_p$ is rendered the p-type, the work function (the work function difference between the well region 500 and the gate electrode 1100B with reference to the side of the well region 500) $\phi_{MS}$ of the first term at the right hand of Eq. (1) becomes greater as compared with the work function in the case of an n-type gate electrode. Concretely, the work function $\phi_{MS}$ becomes +1.1 [V] in the case of the p-type gate electrode (WSi₂/polycrystalline silicon film) 1100B. It becomes +0.9[V] in case of the single layer of a p-type polycrystalline silicon film, and +0.2 [V] in case of the single layer of a refractory metal silicide (WSi₂) film. In case of an n-type polycrystalline silicon film, the work function $\phi_{MS}$ is −0.3 [V]. Accordingly, the quantity of introduction $Q_c$ of the threshold voltage adjusting impurity in the fifth term ($Q_C/C_{OX}$) at the right hand of Eq. (1) becomes smaller in the case of constructing the p-channel MISFET $Q_p$ out of the p-type gate electrode 1100B, than in the case of constructing it out of the n-type gate electrode. That is, the p-channel MISFET $Q_p$ can heighten the impurity concentration of the channel forming region (well region 500) and can therefore make smaller a depletion region which extends from the semiconductor region 1500 or 1800 being the source region or drain region toward the channel forming region. As shown in FIG. 14 (a graph showing the relationship between the channel length and the threshold voltage of the MISFET $Q_p$), the reduction of the extension of the depletion region can prevent the short channel effect of the p-channel MISFET $Q_p$, so that the channel length of the p-channel MISFET $Q_p$ can be reduced to reduce the occupation area thereof. As a result, a higher density of integration of the bipolar-CMOS LSI can be achieved.

By the way, the n-channel MISFET $Q_n$ is constructed of the n-type gate electrode 1100A which affords great work function $\phi_{MS}$. Therefore, the quantity of introduction $Q_C$ of the impurity for adjusting the threshold voltage is small, with the result that the short channel effect can be prevented.

Now, a practicable method of manufacturing the bipolar-CMOS LSI stated above will be briefly described with reference to FIGS. 15 thru 24 (sectional views of the essential portions of the bipolar-CMOS LSI showing respective steps of manufacture).

First, an n-type impurity is selectively introduced into the respective principal surface parts of the regions of a p⁻-type semiconductor substrate 100 for forming a bipolar transistor Tr and for forming a p-channel MISFET $Q_p$. Thereafter, a p-type impurity is selectively introduced into the respective principal surface parts of the regions of the semiconductor substrate 100 for forming an n-channel MISFET $Q_n$ and for forming an element isolating region.

Subsequently, an n⁻-type epitaxial layer 200 is grown on the principal surface of the semiconductor substrate 100 doped with both the n-type impurity and the p-type impurity. By the growth of the epitaxial layer 200, n⁺-type buried semiconductor layers 300 and p⁺-type buried semiconductor layers 400 are respectively formed between the semiconductor substrate 100 and the epitaxial layer 200.

Subsequently, $n^-$-type well regions 500 are formed in the respective principal surface parts of the bipolar transistor Tr forming region and p-channel MISFET $Q_p$ forming region of the epitaxial layer 200. Thereafter, $p^-$-type well regions 600 are formed in the respective principal surface parts of the n-channel MISFET $Q_n$ forming region and element isolating region of the epitaxial layer 200.

Next, an element isolating insulator film 800 is formed on the parts of the principal surface between the semiconductor element forming regions of the well regions 500 and 600. In those principal surface parts of the well regions 600 which underlie the element isolating insulator film 800, p-channel stopper regions 700 are formed by a manufacturing step substantially identical to the step of forming the element isolating insulator film 800.

Next, a thin silicon oxide ($SiO_2$) film, not shown, is formed on the respective principal surfaces of the well regions 500 and 600. The thin silicon oxide film is formed in order to relieve heavy metal contamination ascribable to the introduction of the impurities and damages to the surfaces of the respective well regions 500, 600.

At the next step, an $n^+$-type semiconductor region 900 is selectively formed in the principal surface part of the well region 500 for forming the collector region of the bipolar transistor Tr. By way of example, the semiconductor region 900 is formed in such a way that an n-type impurity is introduced by ion implantation.

At the next step, an impurity for adjusting threshold voltages is selectively introduced into both the principal surface part of the MISFET $Q_p$ forming region of the well region 500 and the principal surface part of the MISFET $Q_n$ forming region of the well region 600. A p-type impurity (B) is employed as the threshold voltage adjusting impurity, and it is introduced into the principal surface parts of the respective well regions 500, 600 through the silicon oxide film, not shown, by ion implantation.

Subsequently, an impurity for adjusting a base concentration is selectively introduced into the principal surface part of the portion of the well region 500 for forming a base region. A p-type impurity is employed as the base concentration adjusting impurity, and it is introduced into the principal surface part of the well region 500 by ion implantation.

Figure 15:
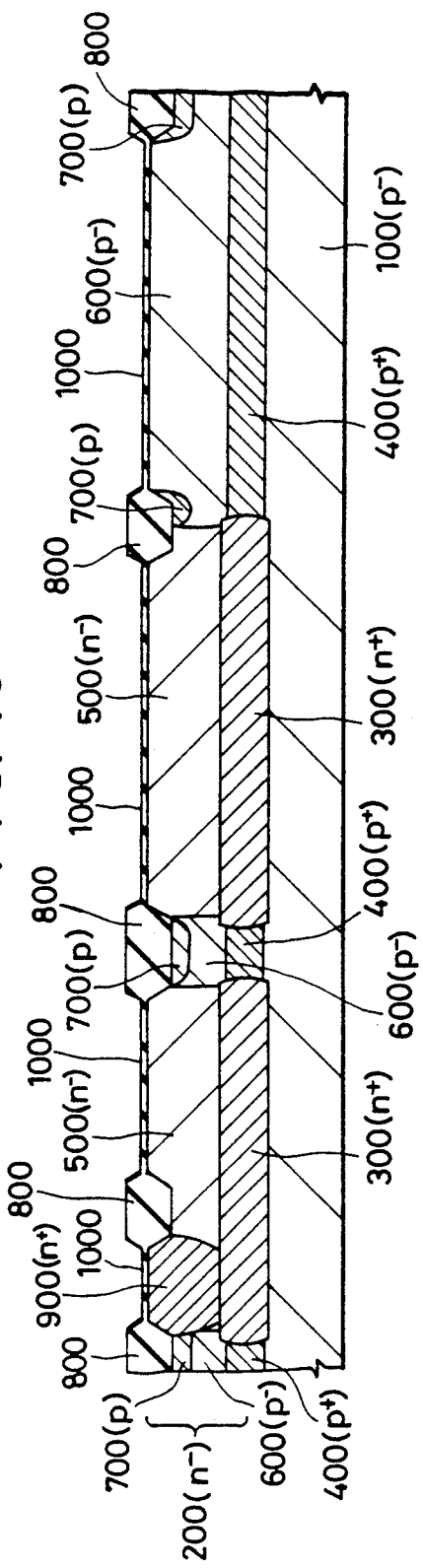

Subsequently, as shown in FIG. 15, a gate insulator film 1000 is formed on those areas of the principal surfaces of the respective well regions 500 and 600 which are other than the element isolating insulator film 800. As the gate insulator film 1000, a silicon oxide ($SiO_2$) film formed by oxidizing the principal surfaces of the respective well regions 500, 600 is used.

Figure 16:
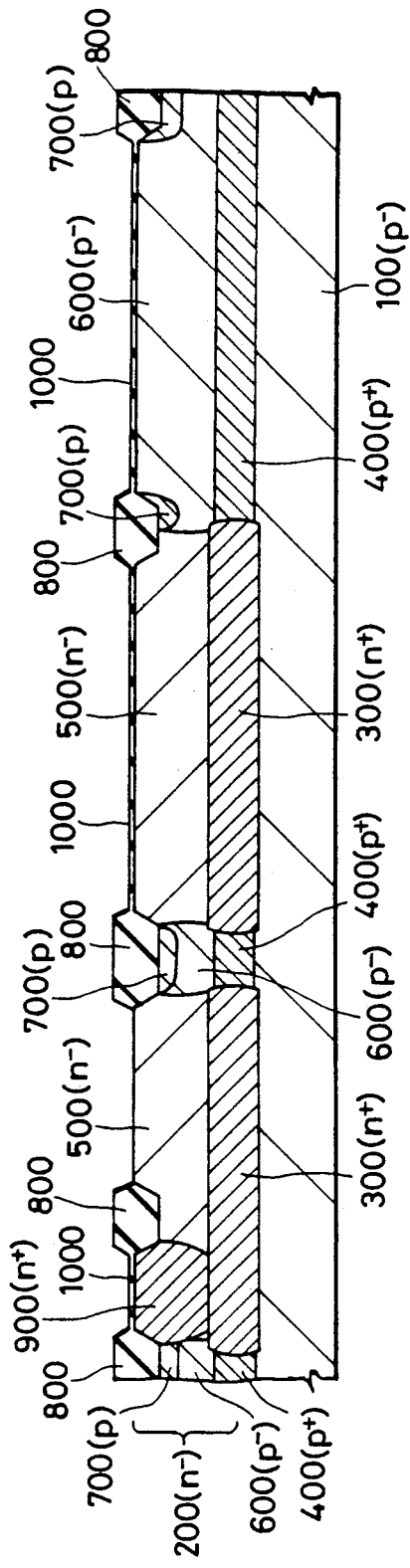

Subsequently, as shown in FIG. 16, the selected part of the gate insulator film 1000 corresponding to regions for forming the base region and emitter region of the bipolar transistor Tr is removed. The removal of the gate insulator film 1000 is performed by a manufacturing step identical to the step of removing the gate insulator film 1000 in that (direct contact) porition within a CMOS transistor forming region, not shown, in which one end of the gate electrode of the MISFET is extended and is directly connected to the source region or drain region thereof.

Figure 17:
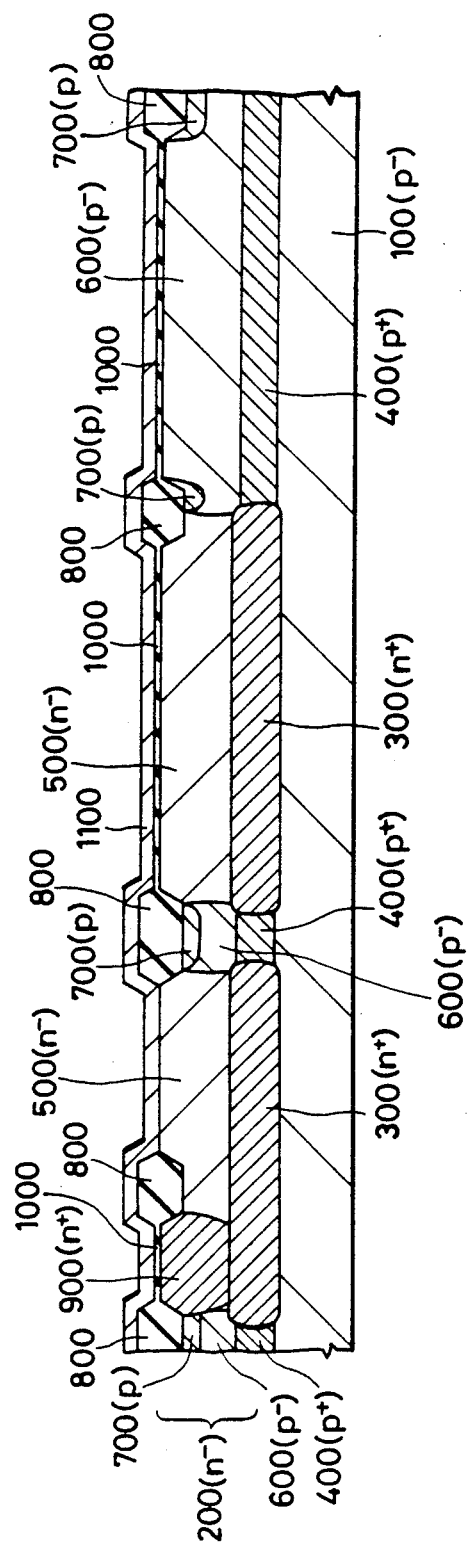

Subsequently, as shown in FIG. 17, a conductor film 1100 is formed on the whole surface of the resultant substrate including the respective regions for forming the bipolar transistor Tr, n-channel MISFET $Q_n$ and p-channel MISFET $Q_p$. The conductor film 1100 is directly connected to the well region 500 in the respective regions for forming the base region and emitter region of the bipolar transistor Tr, and it is formed on the gate insulator film 1000 in the collector region. On the other hand, the conductor film 1100 is formed on the gate insulator film 1000 in the respective regions for forming the MISFETs $Q_n$ and $Q_p$. This conductor film 1100 forms both the base lead-out electrode of the bipolar transistor Tr and the gate electrodes of the MISFETs later. A polycrystalline silicon film which is formed by CVD (Chemical Vapor Deposition) and which is not doped with any impurity or has a low impurity concentration, is employed as the conductor film 1100.

Next, an impurity introducing mask 2700 is formed on the part of the conductor film 1100 overlying the regions for forming the base region and emitter region of the bipolar transistor Tr and the gate electrode of the p-channel MISFET $Q_p$. This mask 2700 is made of, for example, a silicon oxide ($SiO_2$) film formed by CVD.

Figure 18:
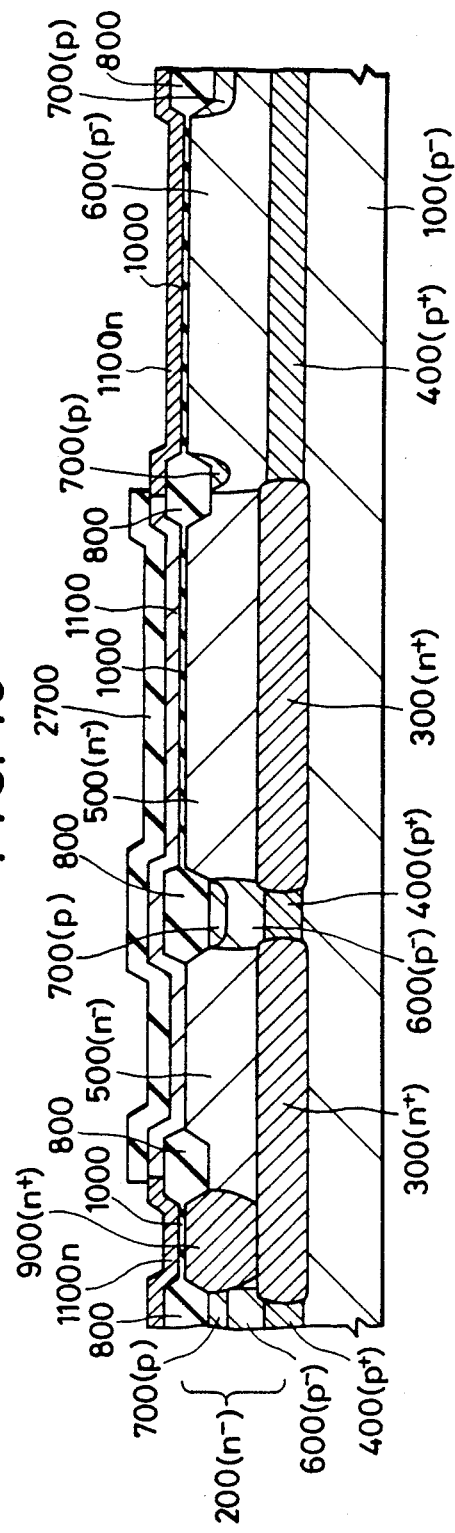

Next, as shown in FIG. 18, using the mask 2700, an n-type impurity is introduced into the part of the conductor film 1100 exposed therefrom, so as to form an n-type conductor film 110n. This n-type conductor film 1100n forms an n-type gate electrode later. The introduction of the n-type impurity into the conductor film 1100 is carried out by diffusion (or doping).

Subsequently, as shown in FIG. 19, the mask 2700 is removed, whereupon an impurity introducing mask 2800 is formed on the exposed surfaces of the conductor films 1100 and 1100n. The mask 2800 is chiefly intended to prevent heavy metal contamination ascribable to the introduction of impurities, and is formed of a silicon oxide ($SiO_2$) film obtained by oxidizing the surfaces of the respective conductor films 1100 and 1100n.

Subsequently, an impurity introducing mask 2900 is formed on the parts of the mask 2800 corresponding to the respective regions for forming the collector region of the bipolar transistor Tr and the gate electrode of the n-channel MISFET $Q_n$. The mask 2900 is formed of, for example, a photoresist film.

Next, using the mask 2900 and through the part of the mask 2800 exposed therefrom, a p-type impurity is introduced into the conductor film 1100 so as to form a p-type conductor film 1100p. This p-type conductor film 1100p forms both the p-type gate electrode of the p-channel MISFET $Q_p$ and the p-type base lead-out electrode of the bipolar transistor Tr later. In the present embodiment, it is also allowed to form the p-type conductor film 1100p beforehand and to thereafter form the n type conductor film 1100n.

Next, the respective masks 2900 and 2800 are successively removed, whereupon as shown in FIG. 20, a refractory metal silicide film 1100m is formed on the respective conductor films 1100n and 1100p. The refractory metal silicide film 1100m is made of, for example, WSi2 formed by sputtering. The boundary parts of the refractory metal silicide film 1100m between the n-type conductor film 1100n and the p-type conductor film 1100p are removed for the reason that the impurities introduced into the respective conductor films might diffuse into the parts, so these parts are unfavorable for the characteristics of the LSI.

At the next step, an insulator film 1300 is formed on the refractory metal silicide film 1100m. The insulator film 1300 is made of, for example, a silicon oxide ($SiO_2$) film formed by CVD.

At the next step, the insulator film 1300, refractory metal silicide film 1100m, n-type conductor film 1100n and p-type conductor film 1100p are successively patterned as predetermined, thereby to form an n-type gate electrode 1100A, a p-type gate electrode 1100B and a p-type base lead-out electrode 1100C as shown in FIG. 21. The patterning is performed by anisotropic etching such as RIE (Reactive Ion Etching). The n-type gate electrode 1100A constructs the gate electrode of the n-channel MISFET $Q_n$. The p-type gate electrode 1100B constructs the gate electrode of the p-channel MISFET $Q_p$. The p-type base lead-out electrode 1100C constructs the base lead-out electrode of the bipolar transistor Tr. Incidentally, as shown in FIG. 21, regarding the p-type base lead-out electrode 1100C, the p-type impurity introduced into the polycrystalline silicon film is diffused into the well region 500 in self-alignment fashion, thereby to form a $p^+$-type semiconductor region 1200 serving as part of the base region.

In this manner, in the bipolar-CMOS LSI, the conductor film 1100 is formed on the whole surface of the substrate, the n-type impurity and p-type impurity are respectively introduced into the selected parts of the conductor film 1100 so as to form the n-type conductor film 1100n and p-type conductor film 1100p, and the conductor films are thereafter subjected to the predetermined patterning so as to form the n-type gate electrode 1100A, p-type gate electrode 1100B and p-type base lead-out electrode 1100C, whereby all of the n-type gate electrode 1100A, p-type gate electrode 1100B and p-type base lead-out electrode 1100C can be formed using the same conductor film 1100 and by the identical manufacturing steps, so that the number of manufacturing steps can be reduced. In particular, according to this embodiment of the present invention, both the p-type gate electrode 1100B and the p-type base lead-out electrode 1100C can be formed by the identical manufacturing step, so that the number of the manufacturing steps of the bipolar-CMOS LSI can be reduced, and besides, as stated before, the density of integration of the bipolar-CMOS LSI can be heightened while the short channel effect of the p-channel MISFET $Q_p$ is prevented.

Subsequently, an insulator film (which is assinged no symbol) is formed on the respective exposed surfaces of the n-type gate electrode 1100A, p-type gate electrode 1100B and p-type base lead-out electrode 1100C and the respective exposed surfaces of the well regions 500 and 600. This insulator film can relieve heavy metal contamination and damages attributed to the introduction of impurities.

Subsequently, an n-type impurity 1400n is introduced into the selected parts of the principal surface of the well region 600 of the n-channel MISFET $Q_n$ forming region by mainly employing the gate electrode 1100A as an impurity introducing mask. The n-type imprity 1400n is introduced by ion implantation. Thereafter, as shown in FIG. 22, a p-type impurity 1500p is introduced into the selected parts of the principal surface of the well region 500 of the p-channel MISFET $Q_p$ forming region by mainly employing the gate electrode 1100B as an impurity introducing mask. The p-type impurity 1500p is introduced by ion implantation.

Subsequently, side wall spacers 1600 are formed on the respective side walls of the n-type gate electrode 1100A, p-type gate electrode 1100B and p-type base lead-out electrode 1100C. The side wall spacers 1600 can be formed in such a way that a silicon oxide ($SiO_2$) film is formed on the whole surface of the substrate by CVD and is subjected to anisotropic etching such as RIE.

Next, an n-type impurity is introduced into the principal surface parts of the well region 600 of the n-channel MISFET $Q_n$ by mainly employing the side wall spacer 1600 as an impurity introducing mask. Owing to the introduction of this n-type impurity and the introduction of the n-type impurity 1400n, $n^+$-type semiconductor regions 1700 and n-type semiconductor regions 1400 are formed, and the n-channel MISFET $Q_n$ is nearly finished up. Incidentally, the n-type impurity for forming the semiconductor regions 1700 is also introduced selectively into the collector region (semiconductor region 900) of the bipolar transistor Tr.

Figure 23:
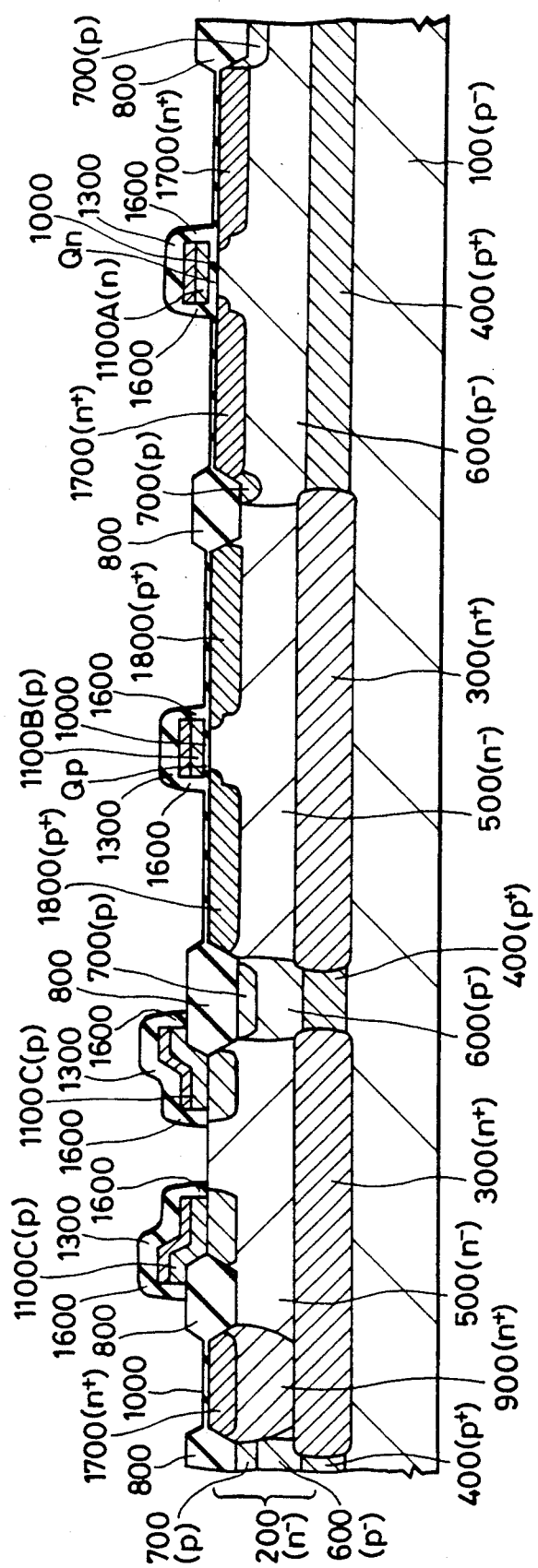

Next, a p-type impurity is introduced into the principal surface parts of the well region 500 of the p-channel MISFET $Q_p$ forming region by mainly employing the side wall spacer 1600 as an impurity introducing mask. Owing to the introduction of this p-type impurity and the introduction of the p-type impurity 1500p, $p^+$-type semiconductor regions 1800 and p-type semiconductor regions 1500 are formed as shown in FIG. 23, and the p-channel MISFET $Q_p$ is nearly finished up.

At the next step, an inter-layer insulator film 1900 which covers the whole surface of the substrate is formed, and that part of the inter-layer insulator film 1900 which corresponds to the emitter region of the bipolar transistor Tr to be formed is removed to form a contact hole 2000. This contact hole 2000 is defined by the side wall spacer 1600 formed on the side wall of the base lead-out electrode 1100C, and is formed in self-alignment to the base lead-out electrode 1100C.

Figure 24:
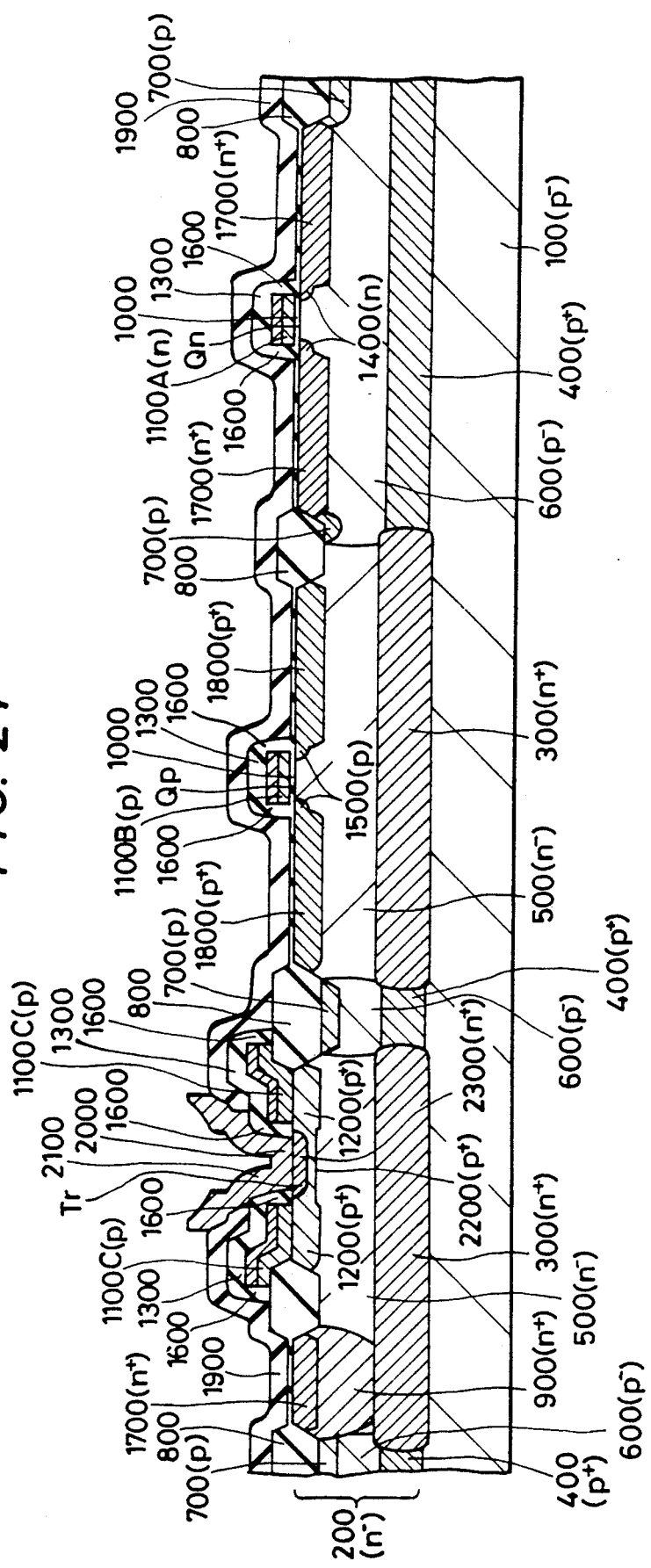

At the next step, an emitter lead-out electrode 2100 is formed on the inter-layer insulator film 1900 so as to touch the surface of the well region 500 through the contact hole 2000. The emitter lead-out electrode 2100 is made of, for example, a polycrystalline silicon film which is formed by CVD and which is not doped with any impurity or has a low impurity concentration. Subsequently, a p-type impurity is introduced through the emitter lead-out electrode 2100 into the principal surface part of the well region 500 where the base region of the bipolar transistor Tr is to be formed, whereby a p-type semiconductor region 2200 is formed. The introduction of this p-type impurity is performed by ion implantation. Subsequently, an n-type impurity for lowering a resistance is introduced into the emitter lead-out electrode 2100. In the case where the SRAM is built in, the introduction of the n-type impurity is performed by a manufacturing step identical to the step of forming high-resistance load elements and power source wiring made of a polycrystalline silicon film and constituting the memory cells of the SRAM. The n-type impurity introduced into the emitter lead-out electrode 2100 is diffused into the principal surface part of the p-type semiconductor region 2200 constituting the base region, in self-alignment fashion, whereby an $n^+$-type semiconductor region 2300 serving as the emitter region is formed as shown in FIG. 24. Owing to the formation of this emitter region, the n-p-n bipolar transistor Tr is nearly finished up.

Thereafter, an inter-layer insulator film 2400, contact holes 2500 and wiring leads 2600 are formed in succession, whereby fabrication of the bipolar-CMOS LSI of the present embodiment is now completed as shown in FIG. 13.

By the way, Embodiment V is applicable to a bipolar-CMOS LSI having a p n-p bipolar transistor. In this case, the base lead-out electrode of the bipolar transistor and the gate electrode of an n-channel MISFET are formed in the n-type by an identical manufacturing step. The gate electrode of a p-channel MISFET is constructed in the p-type.

Although, in the above, the invention made by the inventor has been concretely described in conjunction with the embodiments I–V, it is a matter of course that the present invention is not restricted to the foregoing embodiments, but that it can be variously altered within a scope not departing from the purport thereof.

Figure 12:
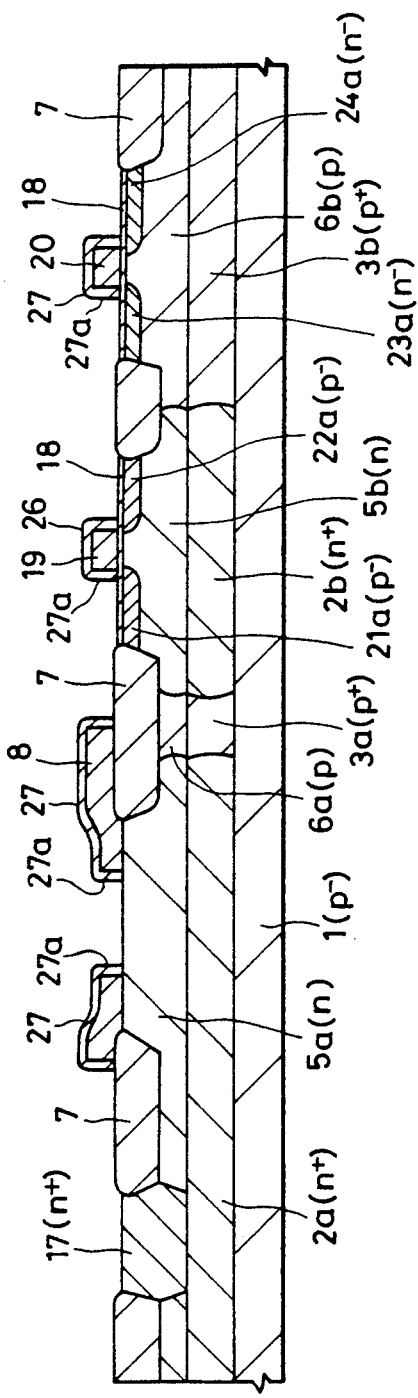
FIG. 12 is a sectional view showing a modified embodiment of the present invention.

By way of example, the side walls (side wall spacers) 12 shown in FIGS. 7 and 8 can also be formed by exploiting the phenomenon of enhanced-speed oxidation of polycrystalline silicon doped with impurities. More specifically, as shown in FIG. 12, a base lead-out electrode 8 which is made of a polycrystalline silicon film doped with a p-type impurity, for example, boron at a high concentration and gate electrodes 19, 20 which are made of a polycrystalline silicon film doped with an n-type impurity, for example, phosphorus at a high concentration are formed, and they are thereafter oxidized at 800° C. in a steam atmosphere for 30 minutes by way of example. Then, thick insulator films 27, for example, SiO$_2$ films 1200 Å thick, are formed on the side surfaces and upper surfaces of the base lead-out electrode 8 and the gate electrodes 19, 20 by the enhanced-speed oxidation phenomenon. On the other hand, only a thin insulator film, for example, SiO$_2$ film 200 Å thick (not shown), is formed on the surface of an epitaxial layer 4 of low impurity concentration. By etching this insulation film about 200 Å, accordingly, insulator films 27a functioning similarly to the side walls 12 can be formed on the side walls of the base lead-out electrode 8 and the gate electrodes 19, 20 as illustrated in FIG. 12.

In addition, unlike the formation of the intrinsic base region 14 by ion implantation, this intrinsic base region 14 can also be formed simultaneously with an emitter region 16 in such a way that a polycrystalline silicon film 26 shown in FIG. 8 is ion-implated with an n-type impurity, for example, arsenic and a p-type impurity, for example, boron and is thereafter subjected to a heat treatment, thereby to diffuse the impurities from the polycrystalline silicon film 26 into an n-well 5a.

Next, it is sometimes the case that the connection portion between this intrinsic base region 14 and the graft base region 11 has not its resistance lowered sufficiently, so the reduction of the base resistance cannot be satisfactorily attained. On this occasion, at the step of ion implantation for forming the respective low impurity concentration portions 21a and 22a of the source region 21 and drain region 22 of the p-channel MISFET Q2, ions are implanted even under the side wall 12, whereby the connection portion between the intrinsic base region 14 and the graft base region 11 can be brought to a sufficiently low resistance. Thus, the reduction of the base resistance can be satisfactorily achieved.

Incidentally, it is of course possible to employ a p-n-p bipolar transistor instead of the n-p-n bipolar transistor Q$_1$.

The present invention is applicable to various LSIs based on bipolar-CMOS LSIs, such as high-speed SRAMs and gate arrays. Embodiments I and II of the present invention are particularly suitable when applied to the high-speed SRAM. That is, the polycrystalline silicon film 26 employed for forming the polycrystalline silicon emitter electrode 15 can be shared for forming high-resistance load elements for use in the memory cells of the SRAM. Conversely, in case of an LSI which has two layers of polycrystalline silicon films, the polycrystalline silicon film 26 employed for forming the polycrystalline silicon emitter electrode 15 can also be used as the second layer polycrystalline silicon film. Accordingly, there is almost no increase in the the number of manufacturing steps for forming the bipolar transistor.

Effects which are attained by typical aspects of performance of the present invention will be briefly explained below:

According to the first aspect of performance, a manufacturing process for a semiconductor integrated circuit device can be simplified.

Besides, according to the second aspect of performance, a semiconductor integrated circuit device can be produced by a simple manufacturing process.

Further, according to improvements (Embodiment V) in the first aspect of performance, the short channel effect of a MISFET can be prevented in a bipolar-CMOS LSI, so that a higher density of integration can be achieved.

What is claimed is:

1. A semiconductor integrated circuit device having an NPN bipolar transistor and at least a P-channel MOSFET comprising:

a semiconductor body having a main surface and including active regions formed at said main surface;

an isolation region selectively formed on said main surface, which surrounds and separates said active regions from each other;

an intrinsic base region of the NPN bipolar transistor formed in a first active region;

an extrinsic base region of the NPN bipolar transistor formed in said first active region, which surrounds and is electrically connected to said intrinsic base region;

a base lead-out electrode of the NPN bipolar transistor formed on said extrinsic base region, which extends from said first active region to said isolation region, and which is made of a stacked conductor layer which includes a portion of a highly condutive p-type polycrystalline silicon layer and a portion of either a refractory metal layer or refractory metal silicide layer provided on an upper surface of said polycrystalline silicon layer;

a side wall made of an insulator provided on a side surface of said base lead-out electrode;

an emitter region of said NPN bipolar transistor formed in said intrinsic base region, which is provided in self-alignment to said side wall;

an emitter lead-out electrode of said NPN bipolar transistor formed on said emitter region, which is electrically connected to said emitter region and which extends over an insulating film formed on an upper surface of said base lead-out electrode;

a gate electrode of the P-channel MOSFET formed on a second active region through a gate insulating film, wherein said gate electrode is made of a stacked conductor layer which includes a different portion of said p-type polycrystalline silicon layer and a different portion of either said refractory metal layer or said refractory metal silicide layer provided thereon;

source and drain regions of the p-channel MOSFET formed in said second active region on both sides of said gate electrode; and wherein said emitter lead-out electrode is electrically separated from said base lead-out electrode by said side wall, and wherein said highly conductive p-type polycrystalline silicon layer portion of said base lead-out electrode is electrically connected to said extrinsic base region.

2. A semiconductor integrated circuit device according to claim 1, wherein said highly conductive p-type polycrystalline silicone layer portion of said base lead-out electrode is doped with boron.

3. A semiconductor integrated circuit device according to claim 2, wherein said extrinsic base region is provided in self-alignment to said base lead-out electrode.

4. A semiconductor integrated circuit device according to claim 1, wherein said emitter lead-out electrode is made of a polycrystalline silicon layer doped with an n-type impurity.

5. A semiconductor integrated circuit device according to claim 1, further comprising a N-channel MOSFET formed at a third device region, wherein a gate electrode of said N-channel MOSFET is formed with an n-type conductor layer insulatedly on said main surface.

6. A semiconductor integrated circuit device according to claim 5, wherein said gate electrode of said N-channel MOSFET is made of a stacked conductor layer which includes an n-type polycrystalline silicon layer and a refractory metal film provided on an upper surface of said n-type polycrystalline silicon layer.

7. A semiconductor integrated circuit device according to claim 1,
wherein said semiconductor body is comprised of a semiconductor substrate and an epitaxial layer thereon; and
wherein said first and second active regions are comprised of well regions formed in said epixtaxial layer.

8. A semiconductor integrated circuit device according to claim 7, further including an n+-type bruied layer collector region and an n+-type collector lead-out electrode electrically connecting said n+-type buried layer collector region to a collector electrode wiring.

9. A semiconductor integrated circuit device according to claim 6, further including a buried layer disposed with respect to each one of said first through third active regions;
wherein said semiconductor body is comprised of a semiconductor substrate and an epitaxial layer thereon; and
wherein said first, second and third active regions are well regions formed in said epitaxial layer.

10. A semiconductor integrated circuit device according to claim 6, wherein said P-channel and N-channel MOSFETs are comprised of lightly-doped drain (LDD) structures.

11. A semiconductor integrated circuit device according to claim 5, wherein said P-channel and N-channel MOSFETs are comprised of lightly-doped drain (LDD) structures.

12. A semiconductor integrated circuit device according to claim 1, wherein said semiconductor body comprises a semiconductor substrate and an epitaxial layer thereon.

13. A semiconductor integrated circuit device having an NPN bipolar transistor and a P-channel MOSFET comprising:
a semiconductor body having a main surface and including active regions formed at said main surface;
an isolation region selectively formed on said main surface, which surrounds and separates said active regions from each other;
an intrinsic base region of said NPN bipolar transistor formed in a first active region;
an extrinsic base region of said NPN bipolar transistor formed in said first active region, which surrounds and is electrically connected to said intrinsic base region;
a base lead-out electrode of said NPN bipolar transistor formed on said extrinsic base region, which extends from said first active region to said isolation region, and which is made of a stacked conductor layer which includes a highly conductive p-type polycrystalline silicon layer and either a refractory metal layer or refractory metal silicide layer provided on an upper surface of said highly conductive p-type polycrystalline silicon layer;
a side wall made of an insulator provided on a side surface of said base lead-out electrode;
an emitter region of said NPN bipolar transistor formed in said intrinsic base region, which is provided in self-alignment to said side wall;
an emitter lead-out electrode of said NPN bipolar transistor formed on said emitter region, which is electrically connected to said emitter region and which extends over an insulating layer formed on an upper surface of said base lead-out electrode;
a gate electrode of the P-channel MOSFET formed on a second active region through a gate insulating film, wherein said gate electrode is made of a stacked conductor layer which includes a highly conductive p-type polycrystalline silicon layer and either a refractory metal layer or refractory, metal silicide layer provided thereon;
source and drain regions of the P-channel MOSFET formed in said second active region on both sides of said gate electrode; and
wherein said emitter lead-out electrode is electrically separated from said base lead-out electrode by said side wall, and wherein said highly conductive p-type polycrystalline silicon layer of said base lead-out electrode is electrically connected to said extrinsic base region.

14. A semiconductor integrated circuit device according to claim 13, wherein said semiconductor body comprises a semiconductor substrate and an epitaxial layer thereon.

* * * * *